United States Patent
Lee et al.

(10) Patent No.: US 9,362,180 B2
(45) Date of Patent: Jun. 7, 2016

(54) INTEGRATED CIRCUIT HAVING MULTIPLE THRESHOLD VOLTAGES

(71) Applicant: GLOBALFOUNDRIES Inc., Grand Cayman (KY)

(72) Inventors: Bongki Lee, Austin, TX (US); Jin Ping Liu, Ballston Lake, NY (US); Manoj Joshi, Clifton Park, NY (US); Manfred Eller, Beacon, NY (US); Rohit Pal, Mechanicville, NY (US); Richard J. Carter, Saratoga Springs, NY (US); Srikanth Balaji Samavedam, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 14 days.

(21) Appl. No.: 14/189,085

(22) Filed: Feb. 25, 2014

(65) Prior Publication Data
US 2015/0243563 A1    Aug. 27, 2015

(51) Int. Cl.
| | |
|---|---|
| H01L 21/8238 | (2006.01) |
| H01L 21/8234 | (2006.01) |
| H01L 27/088 | (2006.01) |
| H01L 29/49 | (2006.01) |
| H01L 21/28 | (2006.01) |
| H01L 27/092 | (2006.01) |

(52) U.S. Cl.
CPC .. *H01L 21/823842* (2013.01); *H01L 21/28088* (2013.01); *H01L 21/82345* (2013.01); *H01L 21/823431* (2013.01); *H01L 27/088* (2013.01); *H01L 27/0886* (2013.01); *H01L 27/092* (2013.01); *H01L 27/0922* (2013.01); *H01L 27/0924* (2013.01); *H01L 29/4966* (2013.01)

(58) Field of Classification Search
None
See application file for complete search history.

(56) References Cited

U.S. PATENT DOCUMENTS

| | | | |
|---|---|---|---|
| 6,448,590 | B1 | 9/2002 | Adkisson et al. |
| 6,797,553 | B2 | 9/2004 | Adkisson et al. |
| 8,252,649 | B2 | 8/2012 | Stahrenberg et al. |
| 8,357,581 | B2 | 1/2013 | Masuoka et al. |
| 8,445,344 | B2 | 5/2013 | Carter et al. |
| 2002/0106858 | A1 | 8/2002 | Zheng et al. |
| 2006/0105527 | A1 | 5/2006 | Saito |

(Continued)

FOREIGN PATENT DOCUMENTS

WO    WO 2009/053251 A1    4/2009

OTHER PUBLICATIONS

Mar. 18, 2015 Restriction Requirement in U.S. Appl. No. 14/188,778.

(Continued)

*Primary Examiner* — Daniel Luke
(74) *Attorney, Agent, or Firm* — Heslin Rothenberg Farley & Mesiti P.C.; Kristian E. Ziegler, Esq.

(57) ABSTRACT

In one aspect there is set forth herein an integrated circuit having a first plurality of field effect transistors and a second plurality of field effect transistor, wherein field effect transistors of the first plurality of field effect transistors each have a first gate stack and wherein field effect transistors of the second plurality of field effect transistors each have a second gate stack, the second gate stack being different from the first gate stack by having a metal layer common to the first gate stack and the second gate stack that includes a first thickness at the first gate stack and a second thickness at the second gate stack.

20 Claims, 17 Drawing Sheets

(56) References Cited

U.S. PATENT DOCUMENTS

| | | |
|---|---|---|
| 2010/0001348 A1 | 1/2010 | Mitsuhashi et al. |
| 2010/0006945 A1 | 1/2010 | Merelle et al. |
| 2010/0155854 A1* | 6/2010 | Stahrenberg ...... H01L 21/82345 257/392 |
| 2013/0049134 A1 | 2/2013 | Sunamura |
| 2013/0130460 A1* | 5/2013 | Liao et al. .................... 438/299 |
| 2013/0241003 A1 | 9/2013 | Lin et al. |
| 2013/0299914 A1 | 11/2013 | Kim |
| 2014/0061814 A1 | 3/2014 | Kim et al. |
| 2014/0203243 A1 | 7/2014 | Xiao |

OTHER PUBLICATIONS

Jun. 1, 2015 Office Action in U.S. Appl. No. 14/188,778.

Joshi et al., "Integrated Circuits With Varying Gate Structures and Fabrication Methods", U.S. Appl. No. 14/188,778, filed Feb. 25, 2014, 38 pages.

Joshi et al., "Integration Method for Fabrication of Metal Gate Based Multiple Threshold Voltage Devices and Circuits", U.S. Appl. No. 14/188,898, filed Feb. 25, 2014, 58 pages.

Zang et al., "Multiple Threshold Voltage Semiconductor Device", U.S. Appl. No. 14/245,656, filed Apr. 4, 2014, 29 pages.

Nov. 4, 2016 Office Action in U.S. Appl. No. 14/245,656.

Jun. 15, 2015 Office Action in U.S. Appl. No. 14/188,898.

Dec. 22, 2015 Office Action in U.S. Appl. No. 14/188,898.

\* cited by examiner

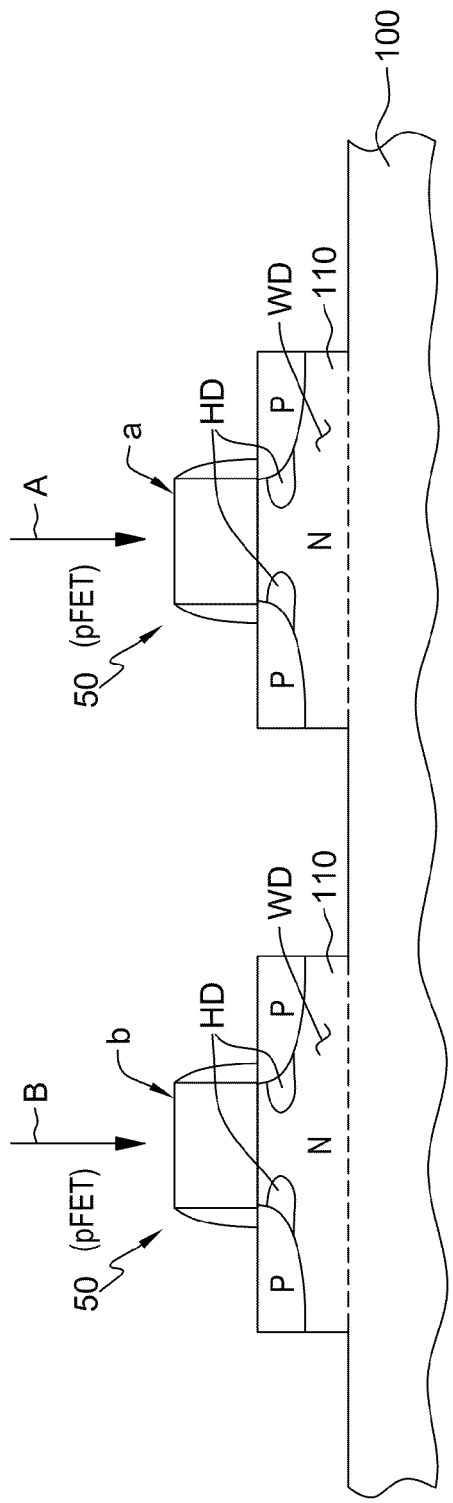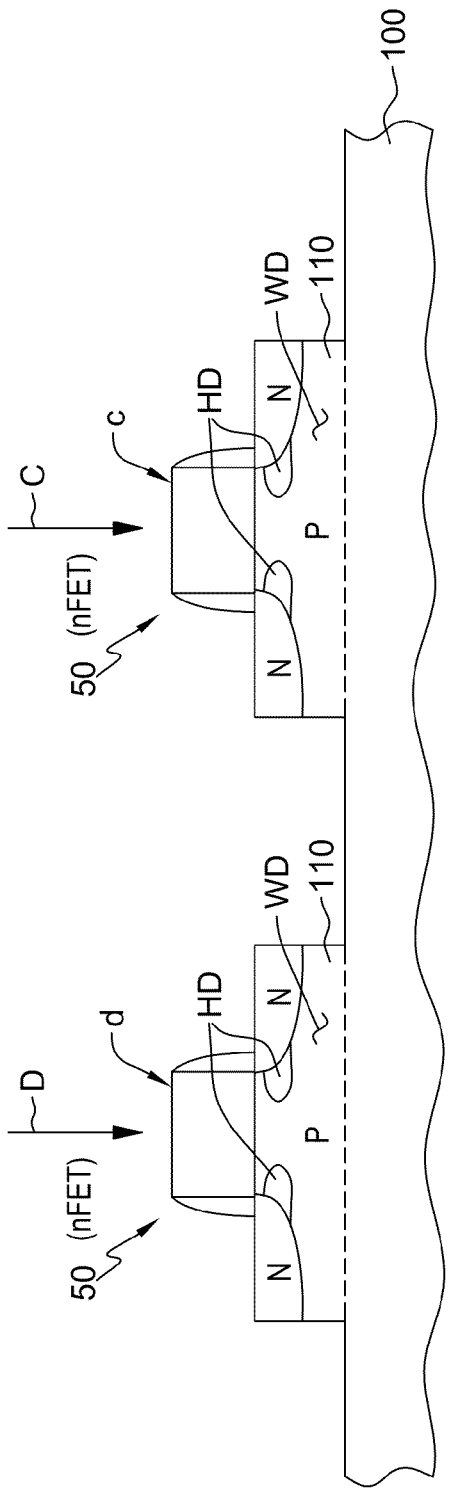
FIG. 1C
FIG. 1D

INTEGRATED CIRCUIT HAVING MULTIPLE THRESHOLD VOLTAGES

FIELD OF THE INVENTION

The present invention relates to semiconductor devices and methods of manufacturing semiconductor devices, and more particularly, to an integrated circuit having multiple threshold voltages.

BACKGROUND OF THE INVENTION

Different semiconductor devices may be fabricated to have one or more different device characteristics, such as switching speed, leakage power consumption, etc. Multiple different designs may each provide optimization of one or more of these characteristics for devices intended to perform specific functions. For instance, one design may increase switching speed for devices providing computational logic functions, and another design may decrease power consumption for devices providing memory storage functions. A system using multiple discrete devices, each optimized for different functions, will result in greater system complexity, increased system footprint, and added system cost.

BRIEF SUMMARY

In one aspect there is set forth herein a semiconductor device having a first plurality of field effect transistors and a second plurality of field effect transistor, wherein field effect transistors of the first plurality of field effect transistors each have a first gate stack and wherein field effect transistors of the second plurality of field effect transistors each have a second gate stack, the second gate stack being different from the first gate stack by having a conductive layer common to the first gate stack and the second gate stack that includes a first thickness at the first gate stack and a second thickness at the second gate stack.

In one aspect there is set forth herein a semiconductor device having a first field effect transistor formed in a substrate structure, and a second field effect transistor formed in the substrate structure. The first field effect transistor can include a first substrate structure doping, a first gate stack, and a first threshold voltage. The second field effect transistor can include the first substrate structure doping, a second gate stack different from the first gate stack, and a second threshold voltage different from the first threshold voltage.

In one aspect there is set forth herein a semiconductor device having a first plurality of field effect transistors formed in a substrate structure, and a second plurality of field effect transistors formed in the substrate structure. A representative field effect transistor of the first plurality of field effect transistors can include a first substrate structure doping and can be configured to have a first gate configuration and first threshold voltage. A representative field effect transistor of the second plurality of field effect transistors can include the first substrate structure doping and can be configured to have a second gate configuration and a second threshold voltage.

In one aspect there is set forth herein a method including forming a first gate in a first region of a substrate structure and a second gate in a second region of the substrate structure so that there is defined on the substrate structure a first field effect transistor having the first gate and further so that there is defined on the substrate structure a second field effect transistor having the second gate, the second gate having a gate configuration different from a gate configuration of the first gate. A method can include doping substrate structures of the first field effect transistor and the second field effect transistor so that the first field effect transistor and the second field effect transistor have a common substrate structure doping configuration.

In one aspect a semiconductor device can include a varying gate structure disposed over a substrate structure, the varying gate structure having a first gate stack in a region of the substrate structure, and a second gate stack in a region of the substrate structure; a first field effect transistor in the region of the substrate structure, the first field effect transistor including the first gate stack of the varying gate structure and having a first threshold voltage; and a second field effect transistor in the region of the substrate structure, the second field effect transistor including the second gate stack of the varying gate structure and having a second threshold voltage, where the first threshold voltage is different from the second threshold voltage.

In another aspect, a method for fabricating a semiconductor device is presented herein. The method includes providing a varying gate structure disposed over a substrate structure, the varying gate structure having a first gate stack in a region of the substrate structure and a second gate stack in a region of the substrate structure, and the providing including: sizing a first layer of the varying gate structure with a first thickness in the region of the substrate structure and a second thickness in the second region of the substrate structure. The method can also include sizing a second layer of the varying gate structure with a first thickness in the first region of the substrate structure and a second thickness in the second region of the substrate structure, where the first thickness first layer is different from the second thickness of the first layer, and the first thickness of the second layer is different from the second thickness of the second layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 1C is a cross sectional view taken along line 1C-1C of FIG. 1B;

FIG. 1D is a cross sectional view taken along line 1D-1D of FIG. 1B;

DETAILED DESCRIPTION

Figure 1A:
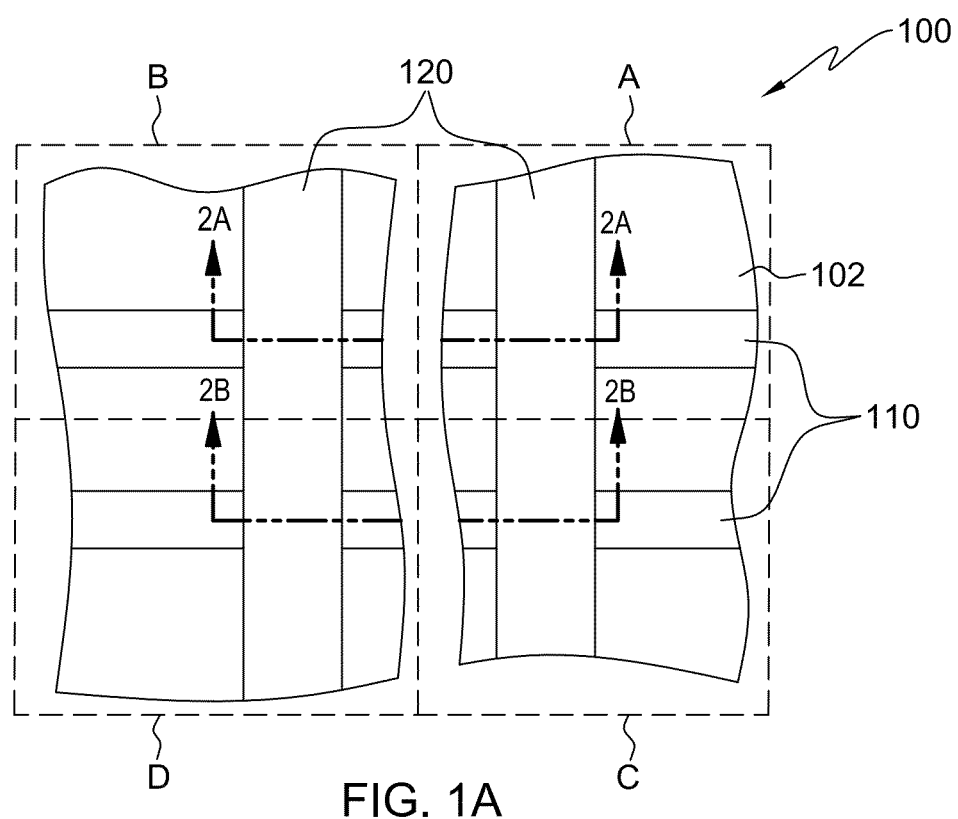
FIG. 1A is a plan view of one embodiment of an intermediate structure obtained during semiconductor device fabrication, and depicts a varying gate structure disposed over a substrate structure, in accordance with one or more aspects as set forth herein.

In one aspect there is set forth herein a semiconductor device having a first plurality of field effect transistors and a second plurality of field effect transistors, wherein field effect transistors of the first plurality of field effect transistors each have a first gate stack and wherein field effect transistors of the second plurality of field effect transistors each have a second gate stack, the second gate stack being different from the first gate stack by having a conductive layer common to the first gate stack and the second gate stack that includes a first thickness at the first gate stack and a second thickness at the second gate stack.

In one aspect there is set forth herein a semiconductor device having a first field effect transistor formed in a substrate structure, and a second field effect transistor formed in the substrate structure. The first field effect transistor can include a first substrate structure doping, a first gate stack, and a first threshold voltage. The second field effect transistor can include the first substrate structure doping, a second gate stack different from the first gate stack, and a second threshold voltage different from the first threshold voltage.

In one aspect there is set forth herein a semiconductor device having a first plurality of field effect transistors formed in a substrate structure, and a second plurality of field effect transistors formed in the substrate structure. A representative field effect transistor of the first plurality of field effect transistors can include a first substrate structure doping and can be configured to have a first gate configuration and first threshold voltage. A representative field effect transistor of the second plurality of field effect transistors can include the first substrate structure doping and can be configured to have a second gate configuration and a second threshold voltage.

In one aspect there is set forth herein a method including forming a first gate in a first region of a substrate structure and a second gate in a second region of the substrate structure so that there is defined on the substrate structure a first field effect transistor having the first gate and further so that there is defined on the substrate structure a second field effect transistor having the second gate, the second gate having a gate configuration different from a gate configuration of the first gate. A method can include doping substrate structures of the first field effect transistor and the second field effect transistor so that the first field effect transistor and the second field effect transistor have a common substrate structure doping configuration.

In one aspect the conductive layer can be proximate a dielectric layer. In one aspect the conductive layer can be adjacent a dielectric layer. In one aspect the conductive layer can be below an etch stop player. In one aspect the first gate stack and the second gate stack can have common channel polarities. In one aspect the field effect transistors of the second plurality of transistors can have a second threshold voltage, the second threshold voltage being different from the first threshold voltage.

Aspects as set forth herein and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, integrated circuits, including field effect transistors (FETs), having a varying gate structure and multiple different threshold voltages. During integrated circuit fabrication, numerous gates for numerous FETs may be desired in a single process which provides one or more gate structures above selected regions of an entire substrate of the integrated circuit. For instance, a layered gate structure, having a uniform stack of layers of materials, may be provided above the selected regions of the entire substrate to form numerous identical gates for numerous FETs. As used herein, a varying gate structure refers to a gate structure that has multiple different stacks of layers, or multiple different gate stacks, that may have different compositions or sizes, in different regions of the integrated circuit. In one example, such a varying gate structure may have different material layers of different thicknesses in the same or different regions. In another example, such a varying gate structure may have a different number of material layers in different regions. In another example a varying gate structure can have different layer sequences in different layers. By using a varying gate structure as described herein, numerous gates with different gate stacks may be formed in a single process.

The threshold voltage of a FET is the minimum voltage required to allow current to flow from a source to a drain through a channel of the FET. Controlling for other factors, in general, a FET with a lower threshold voltage operates faster, but consumes more leakage power, than a FET with higher threshold voltage.

When designing integrated circuits, including, for example, systems on a chip, for use in specific applications, such as mobile phones or media players, it may be desirable to optimize power consumption and speed of the integrated circuit by having different portions of the integrated circuit implemented with FETs having different threshold voltages. For example, it may be desirable to perform logic or arithmetic functions at a relatively higher speed to enable advanced features, and to perform memory storage at a relatively lower speed to save power. In another example, even within a single logic subsystem of an integrated circuit, it may be desirable to optimize the speed of certain FETs and optimize the power consumption of other FETs.

In addition, because modern integrated circuit designs rely on complementary metal oxide semiconductor (CMOS) technology, using both n type FETs (NFETs) and p type FETs (PFETs), integrated circuits combining NFETs and PFETs with multiple threshold voltages are desirable.

Generally stated, provided herein, in one aspect, is an integrated circuit. The integrated circuit includes a varying gate structure disposed over a substrate structure, the varying gate structure having a first gate stack in a region of the substrate structure, and a second gate stack in a region of the substrate structure; a first field effect transistor in the region of the substrate structure, the first field effect transistor including the first gate stack of the varying gate structure and having a first threshold voltage; and a second field effect transistor in the region of the substrate structure, the second field effect transistor including the second gate stack of the varying gate structure and having a second threshold voltage, where the first threshold voltage is different from the second threshold voltage. In one example, a portion of the varying gate structure extends from the first field effect transistor to the second field effect transistor. In another example, the first threshold voltage may be between 80 and 120 millivolts greater than the second threshold voltage. In a further example, the one layer of the varying gate structure includes a work function layer, and the other layer of the varying gate structure includes a cap layer, and the varying gate structure further includes a gate dielectric layer disposed below the cap layer.

In one embodiment, the varying gate structure may include a first layer and a second layer, the first layer having a first thickness in a first region of the substrate structure and a second thickness in a second region of the substrate structure, and the second layer having a first thickness in the first region of the substrate structure and a second thickness in the second region of the substrate structure, where the first thickness of the first layer is different from the second thickness of the first layer, and the first thickness of the second layer is different from the second thickness of the second layer. In such a case, the first thickness of the first layer is less than the second thickness of the first layer, and the first thickness of the second layer is greater than the second thickness of the second layer.

In another embodiment, the substrate structure may include a first fin extending over the region of the substrate structure and a second fin extending over the region of the substrate structure, and the varying gate structure may be conformally disposed over a first fin section and a second fin section. In such a case, the first fin section and the second fin section may be of a common fin.

A method for fabricating a semiconductor device is also provided herein. The method includes providing a varying gate structure disposed over a substrate structure, the varying gate structure having a first gate stack in a first region of the substrate structure and a second gate stack in a second region of the substrate structure, and the providing including: sizing a first layer of the varying gate structure with a first thickness in the first region of the substrate structure and a second thickness in the second region of the substrate structure. In another aspect a method can include sizing a second layer of the varying gate structure with a first thickness in the first region of the substrate structure and a second thickness in the region of the substrate structure, where the first thickness of the first layer is different from the second thickness of the first layer, and the first thickness of the second layer is different from the second thickness of the second layer.

In one example, the integrated circuit includes a first field effect transistor in the region of the substrate structure, and a second field effect transistor in the region of the substrate structure, the first field effect transistor including the first gate stack and having a first threshold voltage, and the second field effect transistor including the second gate stack and having a second threshold voltage, where the first threshold voltage is different from the second threshold voltage.

In one embodiment, sizing the one layer of the varying gate structure may include: depositing, at least partially, a material of the one layer over the region and the region of the substrate structure; removing, at least partially, the material from the region of the substrate structure; and depositing again, at least partially, the material over the region and the region of the substrate structure to form the first thickness of the one layer in the region, and the second thickness of the one layer in the region.

In another embodiment, the substrate structure includes one or more fins extending over the region and the region thereof, and providing the varying gate structure includes providing the varying gate structure conformally over the one or more fins. In such a case, the integrated circuit may include a first field effect transistor in the region of the substrate structure and a second field effect transistor in the region of the substrate structure, the first field effect transistor including the first gate stack and a first fin of the one or more fins, and having a first threshold voltage, and the second field effect transistor including the second gate stack and a second fin of the one or more fins, and having a second threshold voltage, where the first threshold voltage is different from the second threshold voltage.

Reference is made below to the drawings, which are not drawn to scale for ease of understanding, wherein the same reference numbers used throughout different figures designate the same or similar components.

FIG. 1A illustrates one embodiment of an integrated circuit 100 in an intermediate stage of fabrication, in accordance with one or more aspects set forth herein. In one example, as depicted, a gate structure 120 is disposed over a substrate structure. As depicted, in one example, the substrate structure may include a substrate 102 and one or more fins 110, supporting the formation of fin type field effect transistors (Fin FETs) and planar FETs. As depicted in FIG. 1A integrated circuit 100 can include one or more regions. In a region as set forth herein there can be formed a FET having a certain gate stack (gate stack configuration) specific to that region. In the portion of the integrated circuit depicted in FIG. 1A, there are shown four regions A, B, C, D. Integrated circuit 100 can include any number of regions, e.g., 1 to N regions. Each 1 to N region can have a gate stack specific to that region.

Gate structure 120 may extend conformally over (and partially wrap around) the one or more fins 110. In one example, a replacement gate process may be employed, wherein a sacrificial gate of an appropriate material, such as polycrystalline silicon (polysilicon), may be provided at an early stage of circuit fabrication, and then later removed and replaced with a final gate structure. In another example, the gate structure may be formed directly without the use of a sacrificial gate. In either gate process, the gate structure may be formed either before (gate-first) or after (gate-last) the formation of a source region and a drain region of field effect transistors, depending upon the process flow selected.

Substrate 102 may be (in one example) a bulk semiconductor material such as a bulk silicon wafer. As another example, substrate 102 may be or include any silicon-containing substrate including, but not limited to, single crystal Si, polycrystalline Si, amorphous Si, Si-on-nothing (SON), Si-on-insulator (SOI), or Si-on-replacement insulator (SRI) substrates and the like, and may be n type or p type doped as desired for a particular application. In one example, substrate 102 may be, for instance, a wafer or substrate about 600-700 micrometers thick, or less.

Fins 110 may extend from substrate 102, and may include one or more fins in region A and one or more fins in region B. By way of example, fins may be formed by removing one or more portions of the substrate 102 to create the fins from the same material, and same material layer as the substrate 102, such as, for example, a semiconductor or crystalline material. In one example, formation of fins may be achieved by patterning the substrate using any of various approaches, including: direct lithography; sidewall image transfer technique; extreme ultraviolet lithography (EUV); e-beam technique; litho-etch; or litho-etch litho-freeze. Following patterning, material removal may be performed, for example, by any suitable etching process, such as an anisotropic dry etching process, for instance, reactive-ion-etching (RIE) in sulfur hexafluoride ($SF_6$). Although the following numbers are relative and the heights could vary, as one specific example, fins may have a height of about 40 nanometers, and a length of about one micrometer, several micrometers, or the diameter of the entire wafer, and the thickness of fins may be about 10 nanometers or less. In another example, the fins may be formed on the substrate, and the fins and the substrate may be different materials.

Figure 1B:
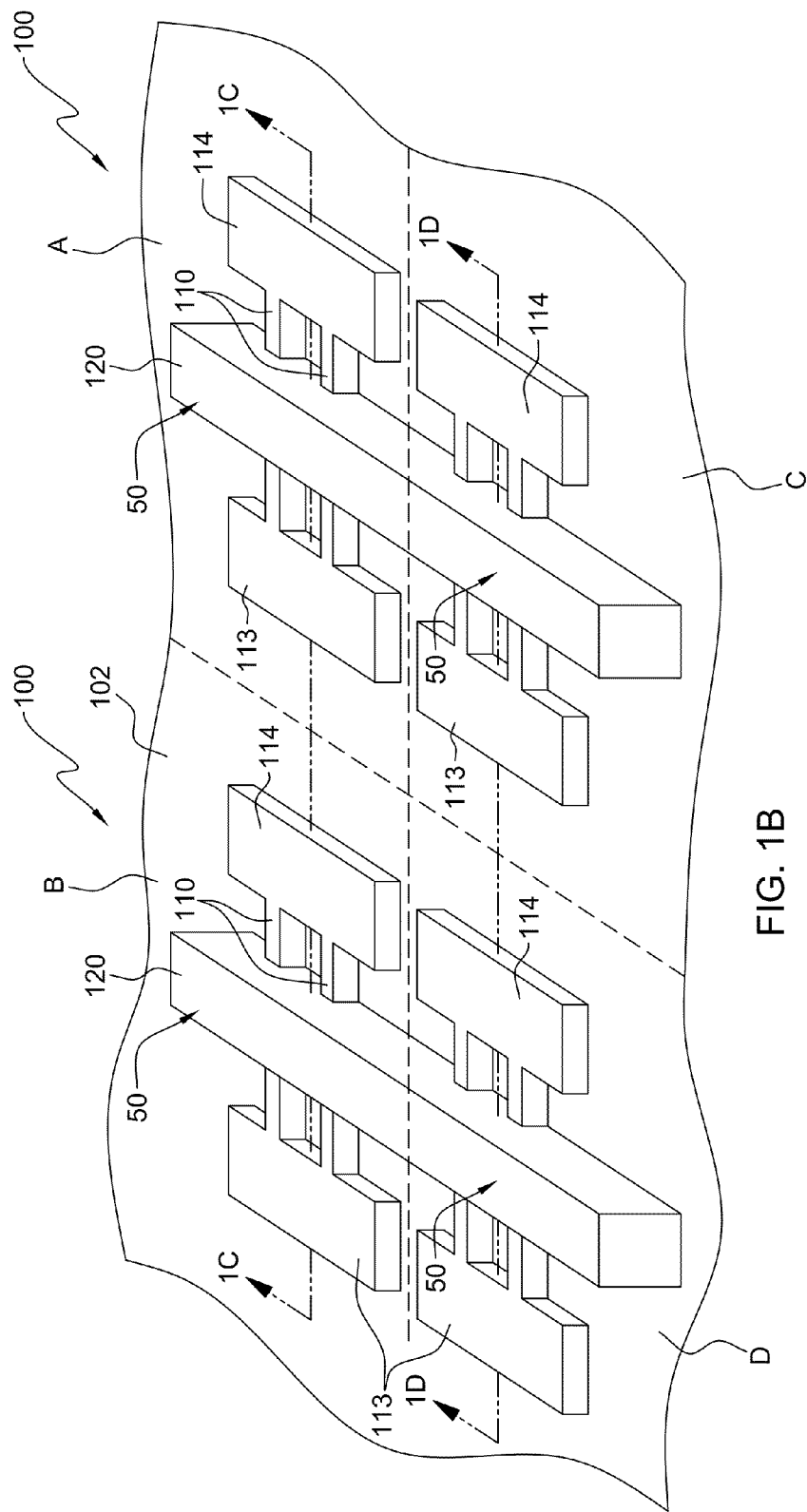
FIG. 1B is an isometric view of one embodiment of an integrated circuit, in accordance with one or more aspects as set forth herein.

Referring to FIG. 1B, a portion of integrated circuit 100 having four field effect transistors (FETs) is illustrated to provide overall context regarding the present invention. In the integrated circuit portion as shown in FIG. 1B, there are four regions A, B, C, D. Each region A B C D can include a FET having a gate stack (gate stack configuration) specific to that region. In the specific embodiment set forth in FIG. 1B, region A can include a FET having gate stack a, region B can include a FET having gate stack b, region C can include a FET having gate stack c, region D can include a FET having gate stack d. A region having a certain gate stack herein can have, in one embodiment a certain sequence gate layer. A gate layer can include a characterizing material and thickness. Different gate stacks, e.g., two or more of the different gate stacks a b c d can have a subset of layers in common and at least one layer not in common between the different gate stacks. A difference between first and second gate stacks can be provided by e.g., a presence of one or more material layer in a first gate stack and an absence of the one or more material layer in the second gate stack, one or more common layers between the first and second gate stacks having different thicknesses, a different ordering and material layers. In one example first and second gate stacks can have respective sequences of gate layer materials that are in common, but one or more layer thicknesses can be differentiated. In one embodiment, integrated circuit 100 can include a single region e.g., only region A, and can include only FETs (or a single FET) having gate stack a. In one embodiment, integrated circuit 100 can be configured so that integrated circuit 100 include two region and further so each FET of integrated circuit 100 is of one of two of gate stacks a b c d. In one embodiment, integrated circuit 100 can be configured so that integrated circuit 100 includes three two regions and further so each FET of integrated circuit 100 is of one of three of gate stacks a b c d. In one embodiment, integrated circuit 100 can be configured so that integrated circuit 100 includes more than four regions, e.g., N regions, N>4, and further so each FET of integrated circuit 100 is one of N different gate stacks.

As best seen in FIG. 1B, a portion of gate structure 120 may extend continuously from a first FET in region A to a second FET in region C, and each FET may include one or more fins, e.g., two fins 110 as depicted in FIG. 1B. In integrated circuit 100, thousands, millions, or more, FETs may be formed. In integrated circuit 100, thousands, millions, or more, FETs may be interconnected. In complementary metal-oxide-semiconductor (CMOS) technology, n type FETs (NFETs) may be interconnected with p type FETs (PFETs), for example, by sharing a common gate structure, or may be connected by metal contacts (not shown). Each FET may include, for instance, any number of fins, depending on the desired circuit design, because having more fins may allow the FET to carry a greater current from a source 113 to a drain 114. For example, as depicted in FIG. 1B for purposes of simplifying highlighting or major aspects each FET has two fins. In a given integrated circuit, there may be a variety of FETs having varying numbers of fins interspersed throughout the integrated circuit 100.

Further aspects of integrated circuit 100 are described with reference to FIG. 1C showing cross sectional views of the FETs 50 depicted in the view of FIG. 1B. In one embodiment, first and second FETs of an integrated circuit 100 can include first and second gate configurations wherein the first and second gate configurations are different from one another. In one embodiment, different gate configurations can be provided by providing different gate stacks (gate stack configurations). Each FET 50 depicted in FIGS. 1C and 1D can include a different gate stack. FET 50 at region A can include gate stack a. FET 50 at region B can include gate stack b. FET 50 at region C can include gate stack c. FET 50 at region D can include gate stack d. In one embodiment each gate stack a b c d can include a different gate length $L_G$. In one embodiment, each gate stack a b c and d can include a common gate length, $L_G$. Each gate stack a b c and d can be defined by varying gate structure 120 which can be disposed on integrated circuit 100 in a manner that the gates of gate structure 120 have a uniform pitch throughout integrated circuit 100.

Referring again to the view of FIG. 1B, the illustrated FETs of each region A B C D can be FETs of adjacent transistor sites. Region A is side adjacent to region B and region C and corner adjacent to region D. Region B is side adjacent to region A and region D and corner adjacent to region C. Region C is side adjacent to region A and region D and corner adjacent to region B. Region D is side adjacent to region B and Region C and corner adjacent to region A. In another embodiment, two or more regions, e.g., region A, region B, region C, region D herein of integrated circuit 100 can each be characterized by including one or more FET having a gate stack specific to that region can be non-adjacent.

Figure 1E:
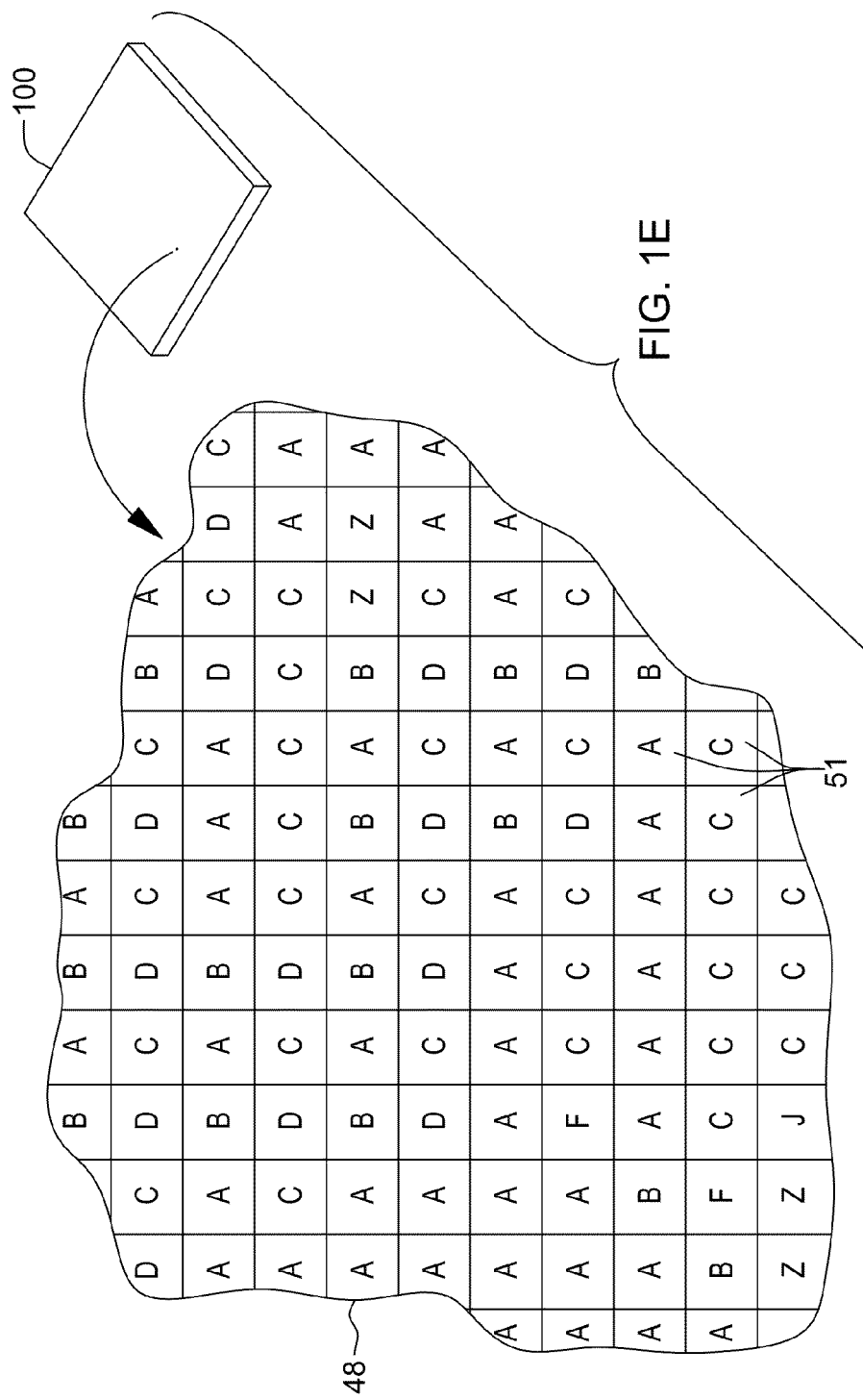
FIG. 1E is a physical form view of a semiconductor device with an exploded view portion indicating a distribution of field effect transistors in a substrate structures having a first and second regions, wherein each of the first and second regions can include a plurality of transistor sites.

Further aspects of integrated circuit 100 are illustrated in FIG. 1E showing a physical form view of integrated circuit 100 typically provided in chip form in combination with an exploded section 48 depicting transistor sites 51 of integrated circuit 100. As depicted in FIG. 1E a particular region, e.g., region A B C or D of integrated circuit 100 in one embodiment can include a plurality of transistor sites, each transistor site 51 having one FET. In one embodiment as depicted in FIG. 1E, a region, e.g., region A or C of integrated circuit 100 can include FETs of adjacent transistor sites 51. In one embodiment as depicted in FIG. 1E, a region, e.g., region A B C or D of integrated circuit 100 can include FETs of nonadjacent transistor sites. In one embodiment, integrated circuit 100 can include greater than or less than four regions, e.g., one region, two regions, three regions or N regions characterized by having a gate stack specific to that region. For example in one illustrative embodiment integrated circuit 100 can include more than 26 regions each having a gate stack specific to that region of which illustrative sections of the regions A B C D F J and Z are depicted in FIG. 1E. The pattern of transistor sites 51 depicted in FIG. 1A can be repeated hundreds, thousands, or millions, of times throughout integrated circuit 100. Each transistor site 51 as shown in FIG. 1E can include one field effect transistor 50 as set forth herein, and as shown e.g., with reference to FIGS. 1B and 1C-1D.

Each field effect transistor 50 within region A depicted in the exemplary embodiment view of FIG. 1E can be fabricated as described with reference to field effect transistor 50 of region A as shown in FIG. 1C. Each field effect transistor 50 within region B depicted in the exemplary embodiment view of FIG. 1E can be fabricated as described with reference to field effect transistor 50 of regions B as shown in FIG. 1C. Each field effect transistor 50 within region C depicted in the exemplary embodiment view of FIG. 1E can be fabricated as described with reference to field effect transistor 50 as shown in region C of FIG. 1C. Each field effect transistor 50 within region D depicted in the exemplary embodiment view of FIG. 1E can be fabricated as described with reference to field effect transistor 50 of region D as shown in FIG. 1C. In one embodiment, region A of integrated circuit 100 can be regarded as including the collection of transistor sites 51 labeled A in FIG. 1E and in one embodiment additional transistor sites not shown in FIG. 1E. In one embodiment, region B of integrated circuit 100 can be regarded as including the collection of transistor sites 51 labeled B in FIG. 1E and in one embodiment additional transistor sites not shown in FIG. 1E. In one embodiment, region C on integrated circuit 100 can be regarded as including the collection of transistor sites 51 labeled C in FIG. 1E and in one embodiment additional transistor sites not shown in FIG. 1E. In one embodiment, region D of integrated circuit 100 can be regarded as including the collection of transistor sites 51 labeled D in FIG. 1E and in one embodiment additional transistor sites not shown in FIG. 1E. In the illustrative schematic diagram of FIG. 1E each transistor site 51 is depicted schematically as having a common size. In a commercial embodiment transistor sites 51 of integrated circuit 100 can have different sizes as determined, e.g., by a number of fins included in a FET, e.g., 1 to M fins, where substrate structure is a FinFET substrate structure.

Providing integrated circuit 100 to include different gate stacks, e.g., two or more of gate stacks a b c d as depicted in FIGS. 1C and 1D provides various advantages. In one aspect, providing integrated circuit 100 to include different gate stacks facilitates precise control of a threshold voltage Vt that is exhibited by a FET. In one embodiment of integrated circuit 100, a process control so that threshold voltages Vt exhibited by first and second FETs 50 of integrated circuit 100 are at targeted threshold voltage values can include providing FETs 50 to have different gate stacks e.g., two or more of gate stacks a b c d. In one variation of such embodiment of integrated circuit 100, threshold voltages Vt exhibited by first and second FETs 50 of integrated circuit 100 can be controlled by providing FETs 50 to have different gate stacks e.g., two or more of gate stacks a b c d in combination with tuning a threshold voltage of the first and second FETs using one or more additional Vt tuning process. The one or more additional Vt tuning process can include, e.g., one or more of well doping and halos doping variation. In one example, a Vt of first FET 50 can be controlled to be different from a Vt of second FET 500 by a processing including differentiating gate stacks between the FETs and also including differentiating one or more of well doping and halos doping between the FETs. In one embodiment, a processing for tuning Vts of different FETs to be different can include only gate configuration tuning with no additional process controls.

In the development of apparatus and methods herein it was observed that tuning Vt between FETs using differentiated well doping and/or differentiated halos doping between FETs can be disadvantageous. Differentiating doping between regions can increase a process mask count and accordingly can increase fabrication costs. Well doping and halos doping can be less effective to control a threshold voltage of FETs of integrated circuit 100 as a scale of integrated circuit 100 is reduced. A varying of well doping and halos doping between different FETs of integrated circuit can increase a likelihood of device performance degradation and can increase a likelihood of performance variability of integrated circuit 100 including performance variability between devices of integrated circuit 100. In some embodiments, providing Vt differentiation between FETs by using one or more of well doping and halos doping can be preferred. In one embodiment of integrated circuit 100, a differentiation of Vt between FETs of first and second different regions of integrated circuit 100 can be provided with use of gate configuration differentiation, e.g., gate stack differentiation and without use of either well doping differentiation or halos doping differentiation. In one variation of such embodiment, FETs 50 of different regions of integrated circuit 100 having different gate stacks, e.g., gate stack a and gate stack b can have a common well doping configuration and a common halos doping configuration between the FETs. In another variation of such embodiment, FETs 50 of different regions of integrated circuit 100 having different gate stacks, e.g., gate stack a and gate stack b can have common well doping between the FETs and can be absent of halos doping.

Characterization of FETs of regions A, B, C, and D of integrated circuit 100 as set forth herein in one embodiment is summarized with reference to Table 1.

TABLE 1

| FET Region | B | A | D | C |
|---|---|---|---|---|
| Gate Length | $L_G = L_{G(0)}$ +/− Knm | $L_G = L_{G(0)}$ +/− Knm | $L_G = L_{G(0)}$ +/− Knm | $L_G = L_{G(0)}$ +/− Knm |
| Channel Polarity (p/n) | p | p | n | n |
| Well Doping | Well Doping Configuration = WD(n)(B) | Well Doping Configuration = WD(n)(A) | Well Doping Configuration = WD(p)(D) | Well Doping Configuration = WD(p)(C) |
| Halos Doping | Halos Doping Configuration = HD(n)(B) | Halos Doping Configuration = HD(n)(A) | Halos Doping Configuration = HD(p)(D) | Halos Doping Configuration = HD(p)(C) |
| Gate Stack | Gate Stack Configuration = b, b ≠ a, b ≠ d, b ≠ c | Gate Stack Configuration = a, a ≠ b, a ≠ c, a ≠ d | Gate Stack Configuration = d, d ≠ a, d ≠ b, d ≠ c | Gate Stack Configuration = c, c ≠ a, c ≠ b, c ≠ d |
| Vt | Vt = Vt (B) ± B mv | Vt = Vt (A) ± A mv | Vt = Vt (D) ± D mv | Vt = Vt (C) ± C mv |

In the embodiment set forth with reference to Table 1, FETs of different regions have different respective gate stacks a b c d and a gate length Lg, that is within a range of gate lengths defined by $L_G = L_{G(0)}$+/−Knm. In one embodiment K=100 nm. In one embodiment K=75 nm. In one embodiment K=50 nm. In one embodiment K=20 nm. In one embodiment K=10 nm. In one embodiment K=5 nm. In one embodiment K=5 nm. In one embodiment K=1 nm. In one embodiment the range of gate lengths is a range of gate lengths that is above a short channel effect range of gate lengths (gate lengths where a short channel effect is observed). In one embodiment the range of gate lengths includes short channel effect gate lengths. In the embodiment set forth with reference to Table 1, substrate structure doping can be used to tune threshold voltage Vts of the various FETs in combination with gate stack tuning of threshold voltage. In each example depicted in Table 1, each region includes a well doping configuration WD and a halos doping configuration HD specific to that region. In another embodiment, each region can include one of a well doping WD configuration and a halos doping HD configuration specific to that region.

Another embodiment of integrated circuit having regions A B C D is set forth in connection with reference to Table 2.

TABLE 2

| FET region | B | A | D | C |
|---|---|---|---|---|
| Gate Length | $L_G = L_{G(0)}$ | $L_G = L_{G(0)}$ | $L_G = L_{G(0)}$ | $L_G = L_{G(0)}$ |
| Channel Polarity (p/n) | p | p | n | n |
| Well Doping | Well Doping Configuration = WD(n)(B) | Well Doping Configuration = WD(n)(A) | Well Doping Configuration = WD(p)(D) | Well Doping Configuration = WD(p)(C) |
| Halos Doping | Halos Doping Configuration = HD(n)(B) | Halos Doping Configuration = HD(n)(A) | Halos Doping Configuration = HD(p)(D) | Halos Doping Configuration = HD(p)(C) |
| Gate Stack | Gate Stack Configuration = b, b ≠ a, b ≠ d, b ≠ c | Gate Stack Configuration = a, a ≠ b, a ≠ c, a ≠ d | Gate Stack Configuration = d, d ≠ a, d ≠ b, d ≠ c | Gate Stack Configuration = c, c ≠ a, c ≠ b, c ≠ d |
| Vt | Vt = Vt (B) ± 5 mv | Vt = Vt (A) ± 5 mv | Vt = Vt (D) ± 5 mv | Vt = Vt (C) ± 5 mv |

In the embodiment set forth with reference to Table 2, FETs of different regions have different respective gate stacks a b c d and a common gate length, $L_G = L_{G(0)}$. In the embodiment set forth with reference to Table 2, substrate structure doping can be used to tune threshold voltage Vts of the various FETs in combination with gate stack tuning of threshold voltage. In each example depicted in Table 2, each region includes a well doping WD and a halos doping configuration HD specific to that region. In another embodiment, each region can include one of a well doping WD and a halos doping configuration specific to that region.

Another exemplary integrated circuit 100 having a distribution of certainly characterized FETs into various regions is described with reference to Table 3.

TABLE 3

| FET region | B | A | D | C |
|---|---|---|---|---|
| Gate Length | $L_G = L_{G(0)}$ +/− Knm | $L_G = L_{G(0)}$ +/− Knm | $L_G = L_{G(0)}$ ± Knm | $L_G = L_{G(0)}$ ± Knm |
| Channel Polarity (p/n) | p | p | n | n |
| Well Doping | Well Doping Configuration = WD(n)(0) | Well Doping Configuration = WD(n)(0) | Well Doping Configuration = WD(p)(0) | Well Doping Configuration = WD(p)(0) |

TABLE 3-continued

| FET region | B | A | D | C |
|---|---|---|---|---|
| Halos Doping | Halos Doping Configuration = HD(n)(0) | Halos Doping Configuration = HD(n)(0) | Halos Doping Configuration = HD(p)(0) | Halos Doping Configuration = HD(p)(0) |
| Gate Stack | Gate Stack Configuration = b, b ≠ a, b ≠ d, b ≠ c | Gate Stack Configuration = b, b ≠ a, b ≠ d, b ≠ c | Gate Stack Configuration = b, b ≠ a, b ≠ d, b ≠ c | Gate Stack Configuration = b, b ≠ a, b ≠ d, b ≠ c |
| Vt | Vt = Vt (B) ± B mv | Vt = Vt (A) ± A mv | Vt = Vt (D) ± D mv | Vt = Vt (C) ± C mv |

In the embodiment set forth with reference to Table 3, FETs of different regions have different respective gate stacks a b c d and a gate length $L_G$, that is within a range of gate lengths defined by $L_G = L_{G(0)} +/- K$ nm. In one embodiment K=100 nm. In one embodiment K=75 nm. In one embodiment K=50 nm. In one embodiment K=20 nm. In one embodiment K=10 nm. In one embodiment K=5 nm. In one embodiment K=5 nm. In one embodiment K=1 nm. In one embodiment the range of gate lengths is a range of gate lengths that is above a short channel effect range of gate lengths (gate lengths where a short channel effect is pronounced). In one embodiment the range of gate lengths includes short channel effect gate lengths. In the embodiment of Table 3, well doping and halos doping is maintained constant for each p well region of regions A B. Further, well doping and halos doping is maintained constant for each n well region of regions C D. Each group of the regions has a common well doping and halos doping configuration. In the embodiment of Table 3 threshold voltage can be tuned by varying gate stack configurations between the regions without varying either well doping or halos doping throughout the regions. In the embodiment of Table 3 threshold voltage can be tuned by varying gate stack configurations between the regions without varying any process variable other than the gate stack. Tuning of threshold voltage Vt without varying of doping of a substrate structure can eliminate or reduce implant induced device performance degradation and variability of integrated circuit 100.

Another exemplary integrated circuit 100 having a distribution of certainly characterized FETs into various regions is described with reference to Table 4.

TABLE 4

| FET region | B | A | D | C |
|---|---|---|---|---|
| Gate Length | $L_G = L_{G(0)}$ | $L_G = L_{G(0)}$ | $L_G = L_{G(0)}$ | $L_G = L_{G(0)}$ |
| Channel Polarity (p/n) | p | p | n | n |
| Well Doping | Well Doping Configuration = WD(n)(0) | Well Doping Configuration = WD(n)(0) | Well Doping Configuration = WD(p)(0) | Well Doping Configuration = WD(p)(0) |
| Halos Doping | Halos Doping Configuration = HD(n)(0) | Halos Doping Configuration = HD(n)(0) | Halos Doping Configuration = HD(p)(0) | Halos Doping Configuration = HD(p)(0) |
| Gate Stack | Gate Stack Configuration = b, b ≠ a, b ≠ d, b ≠ c | Gate Stack Configuration = b, b ≠ a, b ≠ d, b ≠ c | Gate Stack Configuration = b, b ≠ a, b ≠ d, b ≠ c | Gate Stack Configuration = b, b ≠ a, b ≠ d, b ≠ c |
| Vt | Vt = Vt (B) ± mv | Vt = Vt (A) ± 5 mv | Vt = Vt (D) ± 5 mv | Vt = Vt (C) ± 5 mv |

In the embodiment set forth with reference to Table 4, FETs of different regions have different respective gate stacks a b c d and a common gate length, $L_G$. In the embodiment of Table 4, well doping and halos doping is maintained constant for each p well region of regions A B C D. Further, well doping and halos doping is maintained constant for each n well region of regions A B C D. In the embodiment of Table 4 threshold voltage can be tuned by varying gate stack configurations between the regions without varying either well doping or halos doping throughout the regions. In the embodiment of Table 4 threshold voltage can be tuned by varying gate stack configurations between the regions without varying any process variable other than the gate stack. Tuning of threshold voltage Vt without varying of doping of a substrate structure can minimize device performance degradation and minimize the variability of devices of integrated circuit 100.

Referring to the examples of Tables 1-4, it will be seen that if a FET is present on integrated circuit 100 that satisfies all of the identification data of the table indicated example except with respect to one parameter, that FET would be regarded as belonging to a region of integrated circuit 100 other than the one summarized by example. In one embodiment in accordance with Tables 1-4, gate width, $W_G$, can vary between samples of a region. In one embodiment in accordance with Tables 1-4, gate width, $W_G$, is common between each sample FET of each region and between each FET across regions. In one embodiment in accordance with Tables 1-4, gate width, $W_G$, as well as every additional FET dimension is common between each sample FET of each region and between each FET across regions.

Figure 1F:
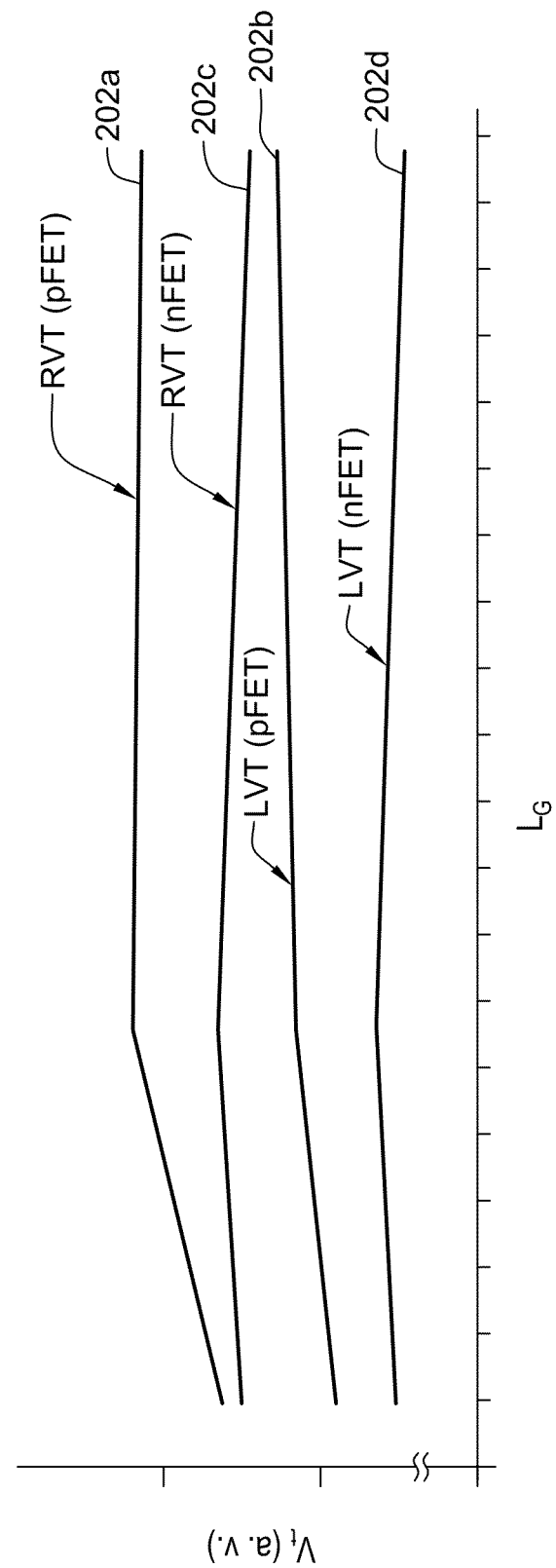
FIG. 1F is a diagram illustrating effect of gate stack differentiation on Vt.
Figure 1G:
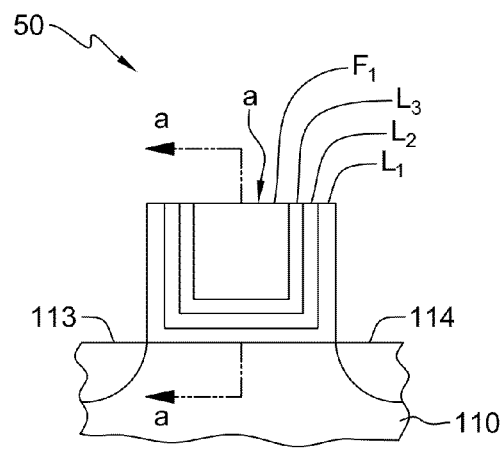
FIG. 1G is a schematic diagram of a gate stack having a gate length of $L_G=x$.

In FIG. 1F there is illustrated empirical data illustrating an effect of varying gate stack configurations in one embodiment. FIG. 1F depicts expected Vt (in arbitrary units, a.u.). $L_G$ data for a span of about 200 nm of gate lengths, where the gate lengths are above a short channel effect range of gate lengths (a range of gate lengths where a short channel effect is pronounced). Illustrative Vt vs. gate length curves (Vt curves) for gate stacks a b c and d are set forth in FIG. 1G. Curve 202*a* is a regular voltage threshold (RVT) Vt curve illustrating threshold voltage of a FET 50 provided by a pFET having gate stack a in one illustrative embodiment. Curve 202*b* is a low voltage threshold (LVT) Vt curve illustrating threshold voltage of a FET 50 provided by a pFET having gate stack b in one embodiment. Curve 202*c* is regular voltage threshold (RVT) Vt curve illustrating threshold voltage of a FET 50 provided by an nFET having gate stack c in one embodiment. Curve 202*d* is low voltage threshold (LVT) Vt curve illustrating threshold voltage of a FET 50 provided by an nFET having gate stack d in one embodiment. In the range of gate lengths above a short channel effect range of gate lengths depicted in FIG. 1F, Vt can be exhibit only modest dependence on gate length. Additional gate length based variations can be expected in a short channel effect region of gate lengths.

In the Examples of Tables 1-4, each FET within a specific region A B C D characterized can be regarded as having a common threshold voltage. However, the tolerance range defining a common threshold voltage can change between the various sample sets of FETs considered. For example in the illustrative example of Tables 2 and 4 where gate length is common for each FET throughout each region, the tolerance range can be smaller than in the case of Tables 1 and 4, where gate length of FETs can be varied through each region. Further, the tolerance range can increase as the range of gate lengths is varied. If a set of FETs spans a certain range of gate lengths above a short channel effect range of gate lengths, the tolerance range can be expected in one embodiment to be less than in the case the set of FETs spans a longer range that includes gate lengths within a short channel effect region of gate lengths. In one embodiment a tolerance range of a common Vt voltage value for FETs of the sample can be +/−10 mV of a mean threshold voltage value in the case a sample set of FETs are of a common gate length. In one embodiment, illustrated with reference to curve 202*c* or curve 202*d* of FIG. 1F a tolerance range of a common Vt voltage value for nFETs of a sample exhibiting voltage thresholds in accordance with Vt curve 202*c* or Vt curve 202*d* can be about +−10 mV of a mean threshold voltage value in the case the sample set of FETs includes an approximately 200 nm range of gate lengths in an exemplary range of gate lengths above a short channel effect range of gate lengths.

In another aspect where first and second FETs (or pluralities of FETs) having common gate stacks are described herein, the aspect of the first and second gate stacks having common threshold voltages can be understood to indicate that voltages of the first and second FETs (or pluralities of FETs) exhibit threshold voltages in accordance with a common gate length vs. Vt curve (a common voltage threshold curve) of which the Vt curves 202*a*, 202*b*, 202*c* of FIG. 1F are examples.

In another aspect where first and second FETs (or pluralities of FETs) having common gate stacks are described herein, the aspect of the first and second gate stacks having different threshold voltages can be understood to indicate that voltages of the first and second FETs (or pluralities of FETs) exhibit threshold voltages in accordance with different gate length vs. Vt curves (different voltage threshold curves), e.g. the different RVT and LVT voltage threshold curves 202*a* and 202*b* of FIG. 1F, and the different RVT and LVT voltage threshold curves 202*c* and 202*d* of FIG. 1F. In the example of FETs having different gate stacks and exhibiting different voltage thresholds in accordance with the different RVT and LVT threshold voltage curves 202*a* and 202*b*, or exhibiting different voltage thresholds in accordance with the different RVT and LVT threshold voltage curves 202*a* and 202*b*, the difference in Vt between FETs having a common gate lengths can be about 100 mv of headroom throughout the range of gate lengths illustrated in FIG. 1F. In another embodiment, the difference in Vt between FETs having a common gate length can be about 50 mv of headroom throughout a range of gate length illustrated in FIG. 1F. In another embodiment, the difference in Vt between FETs having a common gate length can be at about a certain voltage level of headroom throughout the range of gate lengths illustrated in FIG. 1F, where the certain voltage value is between about 50 mv and 150 mv, and one embodiment, between about 80 my and 120 mv. Where first and second FETs with different gate stacks herein have first and second gate lengths, as indicated by the examples of FIG. 1F the first and second FETs can have different Vts, but the difference in Vts can be less than the headroom Vt voltage difference for the FETs, which headroom Vt voltage difference can be a rating based on FETs having common gate lengths. Notwithstanding, a difference of Vts between FETs having different gate stacks can be proximate the Vt headroom voltage difference rating for a range of gate lengths.

Figure 1H:
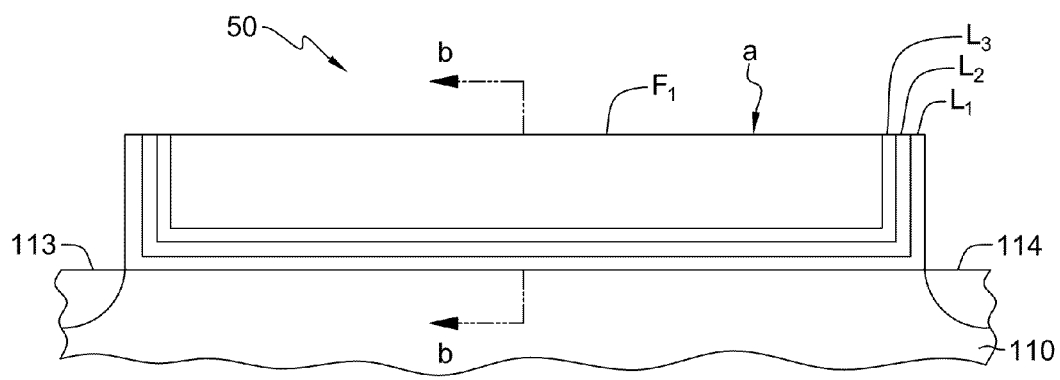
FIG. 1H is a schematic diagram of the gate stack of FIG. 1G having a gate length of $L_G=5x$.
Figure 1I:
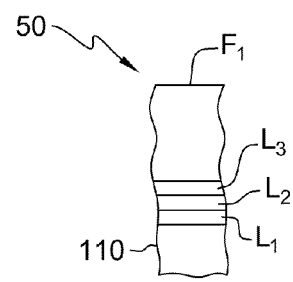
FIG. 1I is a common gate widthwise cross sectional view of the common gate stack shown in FIGS. 1G and 1H taken along line a-a of FIG. 1G and along line b-b of FIG. 1H.

In one embodiment, integrated circuit 100 can be configured so that common gate stacks of FETs within a certain region, e.g. region A, region B, region C, region D, have a common gate length, $L_G$. As illustrated by the examples of Table 1 and 4, integrated circuit 100 can be configured so that common gate stacks of FETs within a certain region of FETs e.g. region A, region B, region C, region D have different gate lengths. As illustrated in reference to FIGS. 1G and 1H first and second FETs 50 can have different gate lengths but a common gate stack (gate stack configuration). For example, the gate stack of FIG. 1G can have a gate length of $L_G=x$ and the gate stack of FIG. 1H can have a gate length of $L_G=5x$. However, as indicated by the center cross section view of FIG. 1I, that is taken along line a-a at the center of the gate stack of FIG. 1G and along line b-b at the center of the gate stack of FIG. 1H, the gate stack (gate stack configuration) shown in FIG. 1G and FIG. 1H can be a common gate stack, as indicated by the different gate lengthened versions of the gate stack having a common gate layer sequence. A common gate layer sequence between first and second FETs can be vertically extending.

Except where indicated by the context otherwise measurement data provided herein is intended to indicate measurement data within industry accepted tolerances.

Figure 1J:
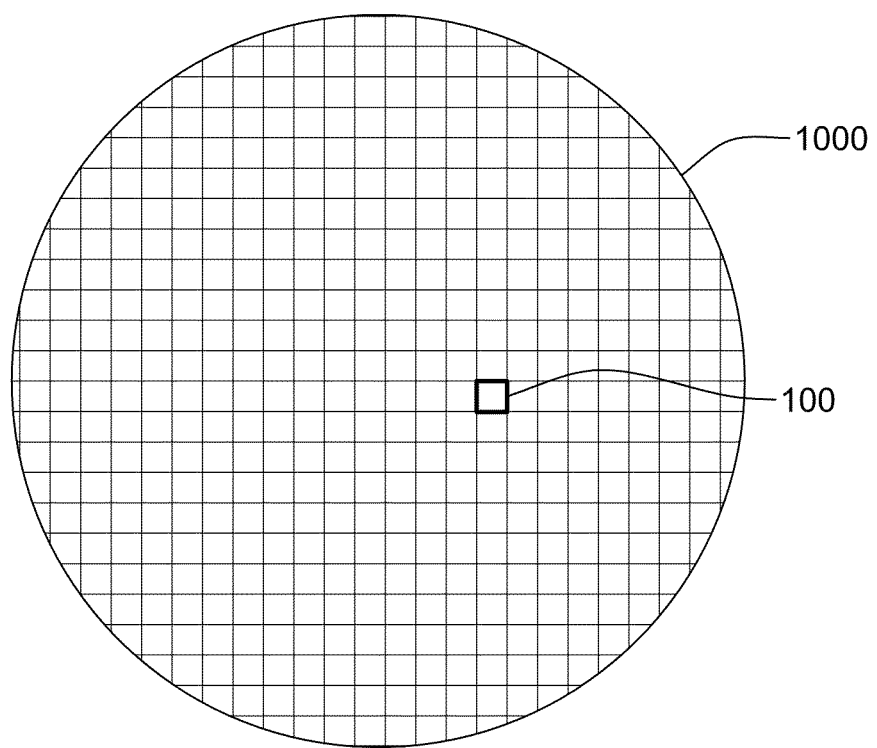
FIG. 1J is a schematic view of a semiconductor wafer defining a plurality of integrated circuits.

Regarding FIG. 1J, FIG. 1J illustrates a semiconductor wafer 1000. A plurality of integrated circuits including integrated circuit 100 can be included in wafer 1000. In the fabrication of integrated circuit 100 a wafer 1000 having integrated circuit 100 can be fabricated. Semiconductor wafer 1000 can be cut to separate integrated circuit 100 from a remainder of integrated circuits defined on wafer 1000. A semiconductor device as referred to herein can include, e.g. a FET formed in a substrate structure, a component of a FET formed in a substrate structure, a plurality of FETs formed in a substrate structure, an integrated circuit 100 having a plurality of FETs formed in a substrate structure or a semiconductor wafer 1000 having a plurality of FETs formed in a substrate structure.

A certain gate stack herein can includes a certain sequence of layers, each layer of the sequence of layers having an associated material and thickness. In one embodiment a second gate stack different from a first gate stack can have a gate material sequence different from a gate material sequence of a first gate stack, e.g. having one or more material layer in a different order or one or more material layer present in one of the first and second gate stacks absent from the other of the first and second gate stacks. In one embodiment, first and second different gate stacks can have a common sequence of layer materials, but can have differentiated thicknesses between one or more layer of the common sequence of material layers.

For reasons explained herein, it may be desirable for different FETs to have different threshold voltages. As disclosed herein, a varying gate structure having different gate stacks in different regions may allow for different threshold voltages to be provided for FETs in those different regions. In addition, because of the different electrical characteristics of NFETs and PFETs, the varying gate structure may allow for common or similar threshold voltages to be selected for NFETs and PFETs, including NFETs and PFETs directly connected by a portion of the varying gate structure. In some cases, there may be a requirement for six or more different threshold voltages. For example, a CMOS integrated circuit may require a pair of regular threshold voltages (RVTs), a pair of low threshold voltages (LVTs), and a pair of super-low threshold voltages (SLVTs), with each pair providing a threshold voltage for each of NFETs and PFETs.

Gate structure 120 may be formed, for example, using the techniques disclosed herein, and may have a first gate stack a in region A and a different gate stack c in region C, allowing for different threshold voltages to be provided for FETs in those different regions with a tuning of the threshold voltages being provided at least in part by controlling gate stacks of the different regions. In another example, a varying gate structure that has different gate stacks a and c respectively in region A and region C may facilitate the configuration of integrated circuit 100 so that a common (or a similar) threshold voltage, Vt, is provided for an NFET in region C as is provided for a PFET in region A.

Figure 2A:
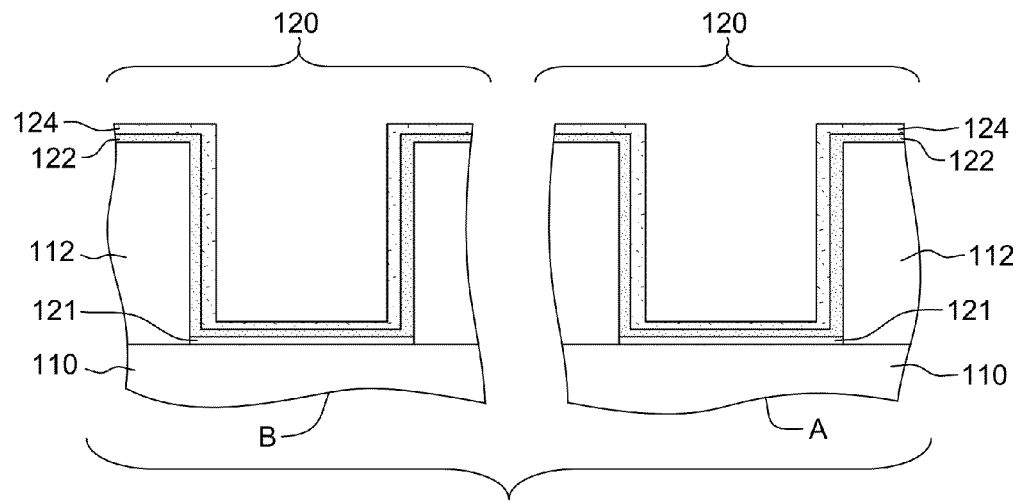
FIGS. 2A-2B are cross-sectional elevation views of the structure of FIG. 1A, and depict the varying gate structure having first and second gate stacks, in accordance with one or more aspects as set forth herein.

An example of a method for fabricating a variable gate structure having a plurality of different gate stacks, e.g. gate stacks a b c d as set forth in Tables 1-4 in different regions A B C D of device and/or integrated circuit 100 is illustrated in reference to the views of FIGS. 2A-11B. FIG. 2A illustrates the structure of FIG. 1A, taken along line 2A-2A thereof, and a varying gate structure 120 extending over fin 110. As shown, in the stage view of FIGS. 2A and 2B, gate structure 120 is in an intermediate stage of fabrication. Spacers 112 may facilitate formation of multiple layers by, for example, containing the material deposited to form each layer. In one example, a gate structure 120 can include a dielectric layer 122, a cap layer 124, and another cap layer 126. In one example, a gate structure can include a dielectric layer 122 and, a cap layer 124.

By using a series of protective masks that protect some regions of the substrate structure and expose regions of the substrate structure, a varying gate structure, rather than a uniform gate structure, may be formed, with multiple different gate stacks, such as material layers having varying thicknesses, in multiple different regions, enabling FETs having multiple different threshold voltages. The varying gate structure may enable multiple different threshold voltages because the threshold voltage of a FET is influenced by the electrical properties of the gate, which is located between a channel of the FET and a gate contact that applies a gate voltage to the gate. By sizing or tuning the varying gate structure to have different gate stacks in different regions, different threshold voltages may be achieved, because in a FET, the threshold voltage is directly related to how the gate voltage influences the behavior of charge carriers located in a channel underlying the gate.

In one example, dielectric layer 122 may be a material including silicon, such as silicon dioxide, or silicon oxynitride. In another example, dielectric layer 122 may be a high dielectric constant (high-k) material having a dielectric constant greater than, for example, about 3.9 (the dielectric constant of silicon dioxide), including, but not limited to one or more of hafnium oxide, tantalum oxide, zirconium oxide, titanium oxide, or aluminum oxide. In one example, dielectric layer 122 may be a high-k material having a thickness of about 15 angstroms (Å). Prior to depositing dielectric layer 122 in an area delimited by spacers 112, an oxide layer 121 can be thermally or chemically grown on fin 110. Oxide layer 121 can provide a dielectric layer so that a formed gate stack includes a dielectric layer provided by oxide layer 121 as well as a dielectric layer provided by dielectric layer 122. Providing a formed gate stack to include multiple dielectric layers can improve capacitive coupling to a channel region below the gate stack and can reduce leakage current.

Figure 2B:
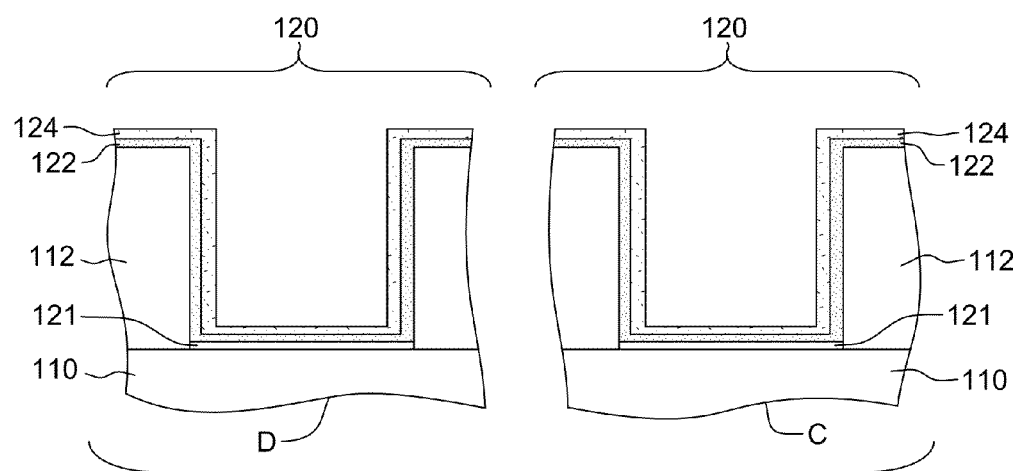

Cap layer 124 may be included to protect dielectric layer 122 from damage during various processing steps. In one example, cap layer 124 may be a metal titanium nitride (TiN) cap layer having a thickness of about 10 Å. Cap layer 124 can be deposited to be adjacent to dielectric layer 122 as is illustrated in FIGS. 2A and 2B. In the development of apparatus and methods herein it was determined that cap layer 124 can effect a work function of a field effect transistor. In accordance with one aspect herein cap layer 124 can be sized to have different thicknesses in different regions, e.g. between regions A and B or between regions C and D of integrated circuit 100 for tuning of a voltage threshold, Vt. For sizing of cap layer 124 as will be set forth herein, cap layer 124 can be deposited by depositing a first sublayer of material forming cap layer 124, removing material of the sublayer in a first region without removal of material of the sublayer from a second region, and depositing a second sublayer of material forming cap layer 124 in both the first and second regions. As a result of such process, cap layer 124 can include a greater thickness in a second region than a first region.

Each of dielectric layer 122 and cap layer 124 as well as cap layer 126, work function layer 128 and work function layer 130 to be described herein may be deposited using any of a variety of deposition processes, including, for example, physical vapor deposition (PVD), atomic layer deposition (ALD), chemical vapor deposition (CVD), sputtering, or other known processes, depending on the material composition of the layer. The deposition may conform to the substrate structure, including wrapping around fins 110. The deposition of a given layer can conform to a deposition of its preceding layer.

FIG. 2B illustrates the structure of FIG. 1, taken along line 2B-2B thereof. In one embodiment of the fabrication methods disclosed herein, at the stage of fabrication illustrated in FIGS. 2B-2B, gate structure 120 may include identical layers having common sizes in region A and region B. In another example, the sizes and composition of the layers may already vary at the stage of fabrication depicted.

FIGS. 2A-11B illustrates one embodiment of a process for sizing a layer of gate structure 120. In this set of examples, a cap layer of gate structure 120 may be sized to have different thicknesses in different regions of the substrate structure.

In the process depicted in FIGS. 2A-11B, an additive and subtractive process is used to size a cap layer. Such a process may be preferable to an additive only process, because deposition processes used to add material to the cap layer may not be compatible with masking techniques required. However, if appropriate masking techniques may be used, then an additive only process could be used to size the cap layer.

Figure 3A:
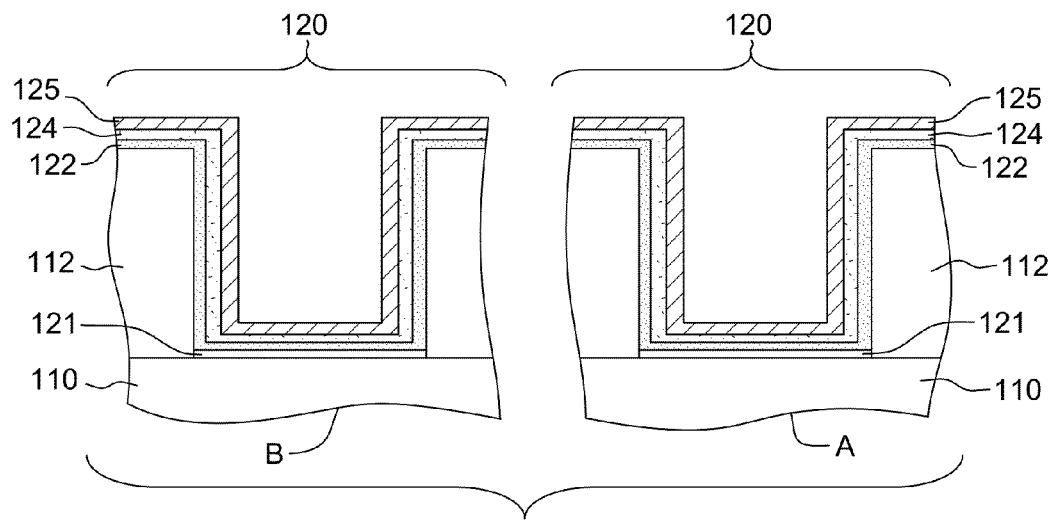
FIGS. 3A-3B depict the structure of FIGS. 2A-2B after depositing a sacrificial amorphous silicon layer in accordance with one or more aspects as set forth herein.
Figure 3B:
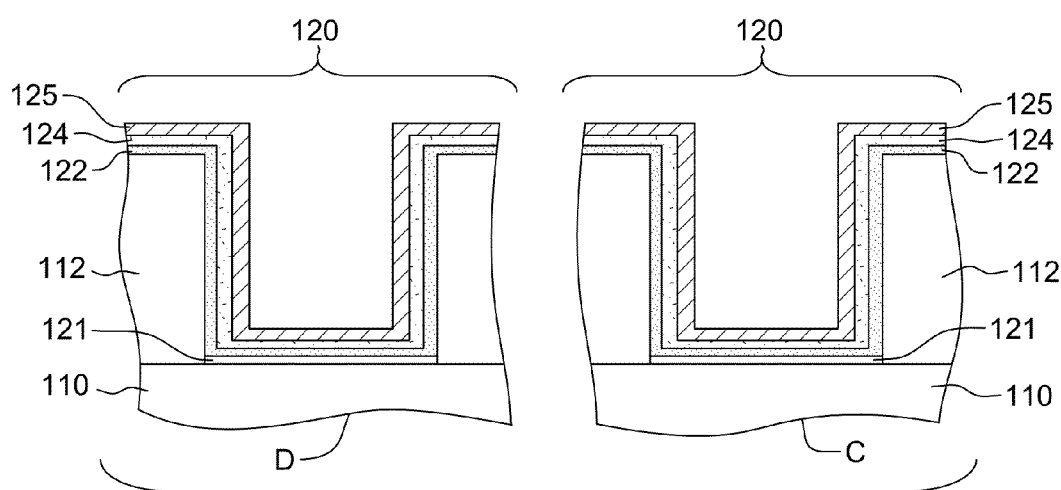

In FIGS. 3A and 3B there is depicted a process of adding and amorphous silicon A-Si layer 125 to layer 124. A-Si layer 125 can be added as a sacrificial layer and then removed. Adding A-Si layer 125 to layer 124 and then removing layer 125 improves reliability of layer 124.

Figure 4:
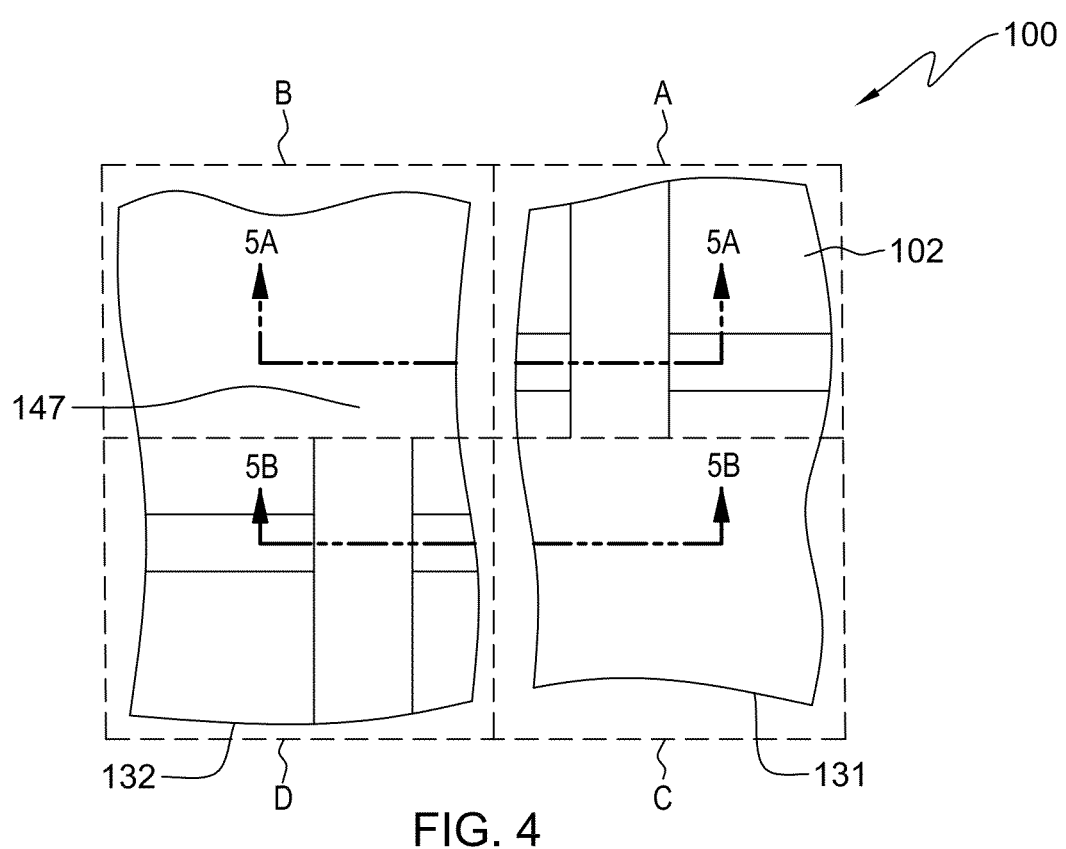
FIG. 4 illustrates the structure of FIGS. 3A-3B after removal of the sacrificial amorphous silicon layer and after providing a protective mask over first and second regions of the substrate structure, in accordance with one or more aspects as set forth herein.

FIG. 4 illustrates the structure of FIGS. 3A-3B after removal of layer 125 and after providing a protective mask 147 having masking properties over region B and region C of the substrate structure, leaving region A and region D exposed to the further processing steps to be set forth with respect to FIGS. 5A-6B. As protective mask 147 may be provided over an entirety of the substrate structure including substrate 102 and fins 110 defining integrated circuit 100, and then patterned using standard lithographic processing, to reveal region A and region D, and protect region B and region C. FIG. 4 illustrates one portion of a larger integrated circuit 100, and region B and region C may each be a discontinuous region having many portions protected by protective mask 147, depending upon the specific integrated circuit being fabricated.

In one example, protective mask 147 may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in circuit structure 100. For instance, protective mask 147 may be or include an organic material. For instance, flowable oxide such as, for example, a hydrogen silsesquioxane polymer, or a carbon-free silsesquioxane polymer, may be deposited by flowable chemical vapor deposition (F-CVD). In another example, protective mask 147 may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Figure 5A:
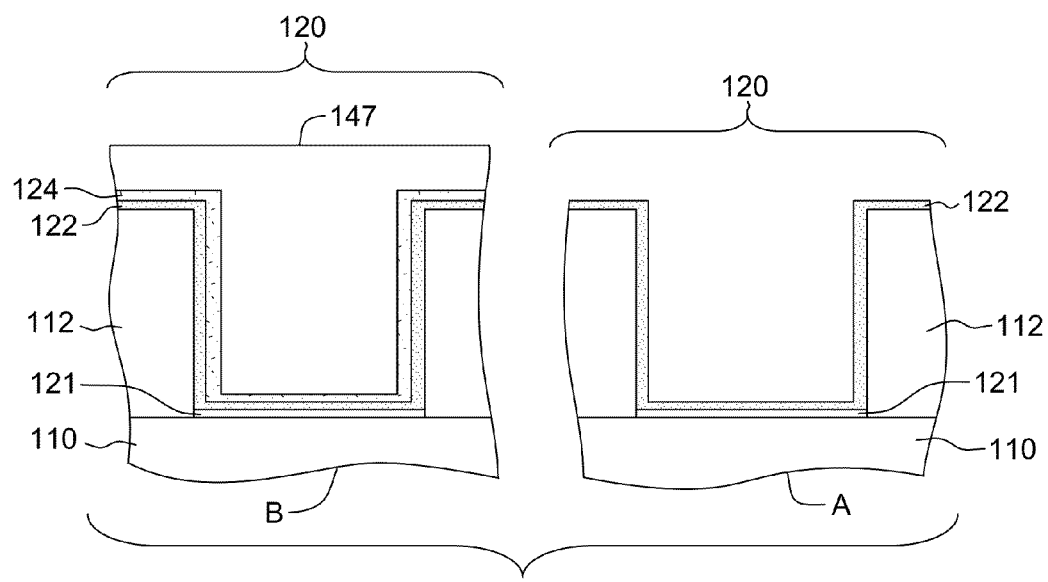
FIGS. 5A-5B depict the structure of FIG. 3A-3B after removing, at least partially, material from unmasked regions of the substrate structure, in accordance with one or more aspects as set forth herein.
Figure 5B:
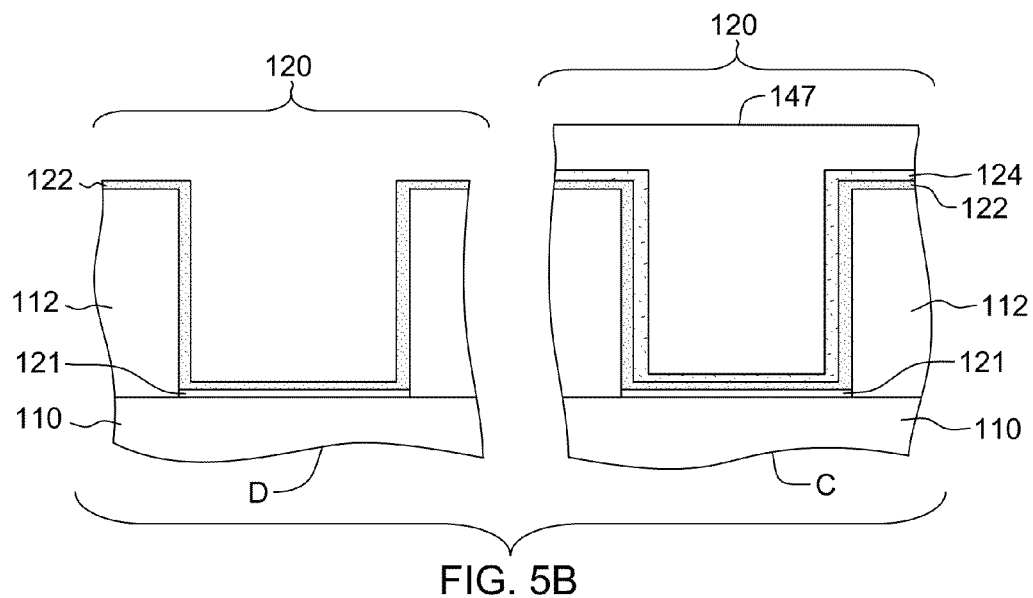
Figure 6A:
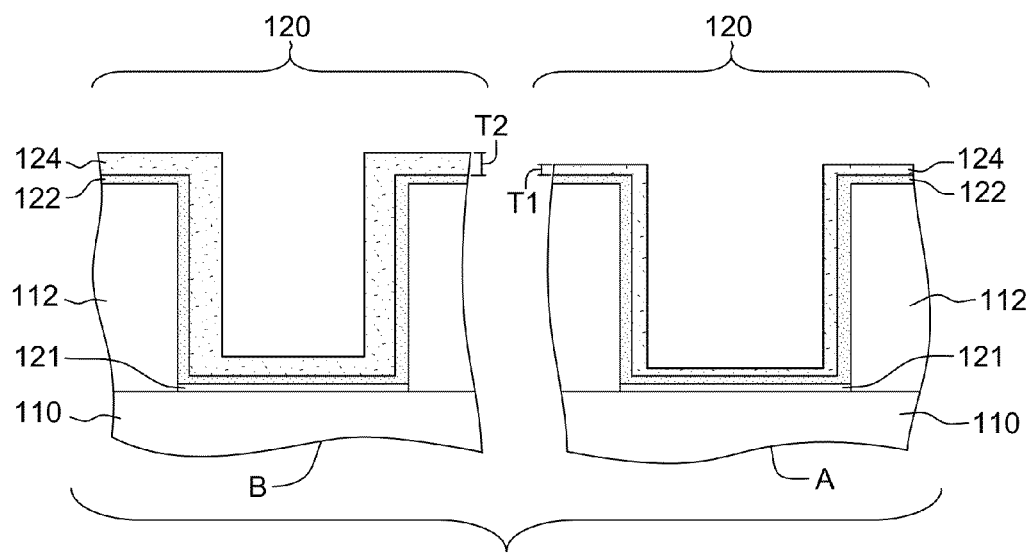
FIGS. 6A-6B depict the structure of FIGS. 5A-5B after sizing one layer of the varying gate structure, in accordance with one or more aspects as set forth herein.
Figure 6B:
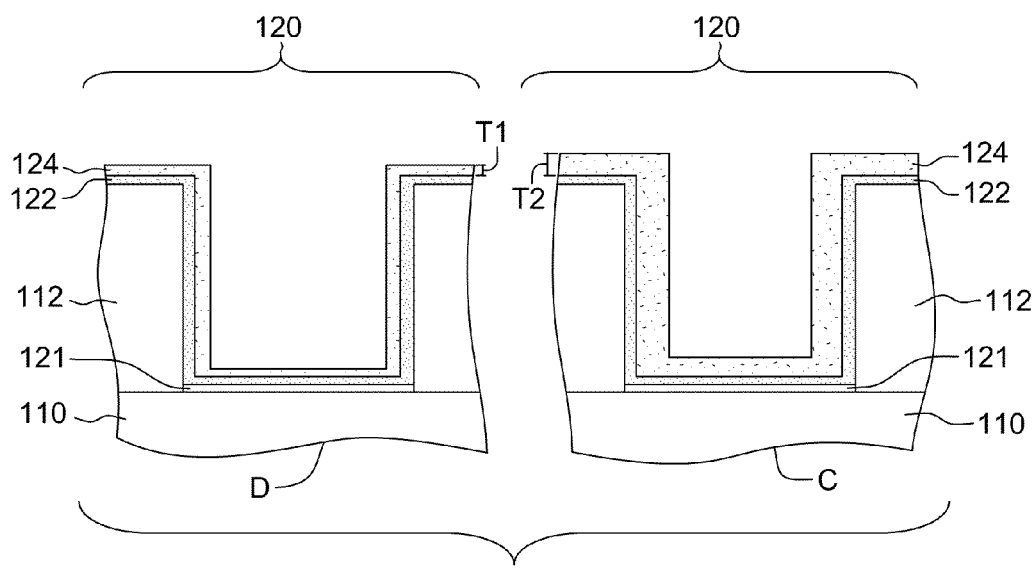

FIG. 5A illustrates the structure of FIG. 4, taken along line 5A-5A thereof, and FIG. 5B illustrates the structure of FIG. 4, taken along line 5B-5B thereof. FIGS. 5A and 5B illustrate removal of cap layer 124 from region A and from region D, respectively. After removal of cap layer 124 from region A and from region D mask 147 can be removed as is depicted in FIGS. 6A and 6B. As depicted, in one example, a process for sizing cap layer 124 includes removing material of cap layer 124 from region A and region D of the substrate structure, and leaving unchanged cap layer 124 in region B and region C. In another example, the material may be removed partially, in order to reduce a thickness of cap layer 124 in region A and region D. Removing the protective mask may be achieved using any suitable process, such as chemical-mechanical polishing (CMP), or etching, depending on the chemistry of the protective mask.

Removing cap layer 124 may be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material of cap layer 124. Protective mask 147 ensures that material of cap layer 124 is not removed from region A during such a removal process.

FIGS. 6A-6B illustrate the structure of FIGS. 5A-5B after depositing material of cap layer 124 (a second sublayer) over regions A, B, C and D of the substrate structure. In one example, as depicted, depositing the material provides cap layer 124 with a first thickness $T_1$ in region A and region D, and a second thickness $T_2$ in region B and region C. As depicted $T_1$ may be less than $T_2$, but in another example, $T_2$ may be greater than $T_1$. The material may be deposited by variety of deposition processes, including, for example, physical vapor deposition (PVD), atomic layer deposition (ALD), or chemical vapor deposition (CVD). For example, cap layer 124 may be or include a conductive material such as TiN or TaN, and have a thickness between 10 Å and 20 Å. In one specific example, cap layer 124 may be TiN, and have thickness $T_1$ of 20 Å in region A, and thickness $T_2$ of 10 Å in region B. Regarding layer 124, a depositing of layer 124 can include depositing a first sublayer of layer 124 as shown in FIGS. 2A and 2B, and depositing a second sublayer of layer 124 on the first layer in region B and region C after removal of a sacrificial amorphous silicon layer from the first sublayer.

FIGS. 2A-12B illustrate an example of a process of sizing (or varying) one or more layer of gate structure 120. One or more of a cap layer or a work function layer of varying gate structure 120 may be sized to have different thicknesses in different regions of the substrate structure, enabling different gate stacks in the different regions. The work function of a material is an electrical property of a conductor that describes the minimum energy required to remove an electron from the material. A work function layer of a gate structure, therefore, is a material layer that directly impacts the threshold voltage because it influences the amount of energy required for electrons to flow from the gate stack to a gate contact, and thereby influences the amount of energy available to attract charge carriers in a channel underlying the gate. In addition, the previously described process of sizing a cap layer may influence the vertical position of the after formed work function layer with respect to the underlying channel. These different factors work together to allow the creation of a varying gate structure defining different threshold voltages.

Figure 7A:
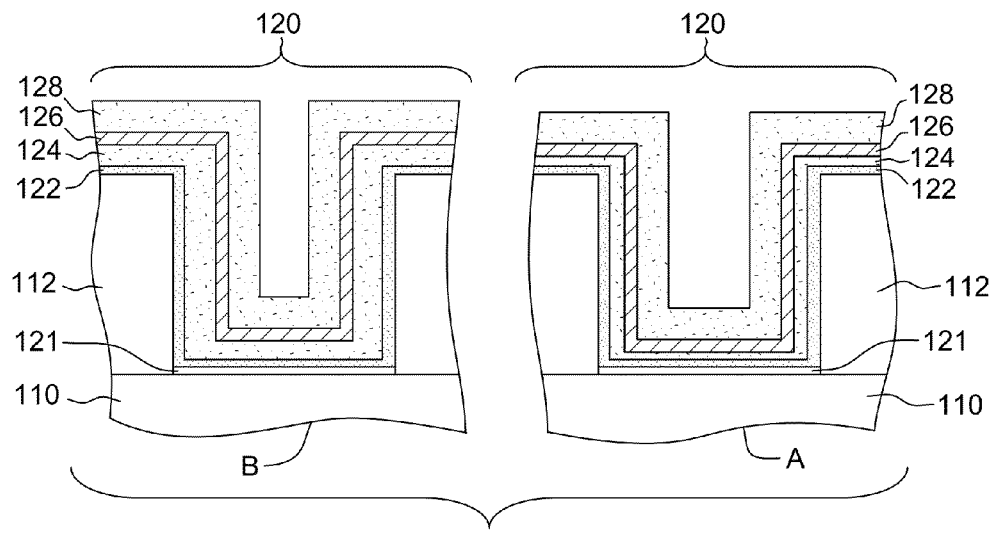
FIGS. 7A-7B depict the structure of FIGS. 6A-6B after depositing, at least partially, another material of another capping layer over the substrate structure, and after depositing a first layer of a work function layer over the substrate structure in accordance with one or more aspects as set forth herein.
Figure 7B:
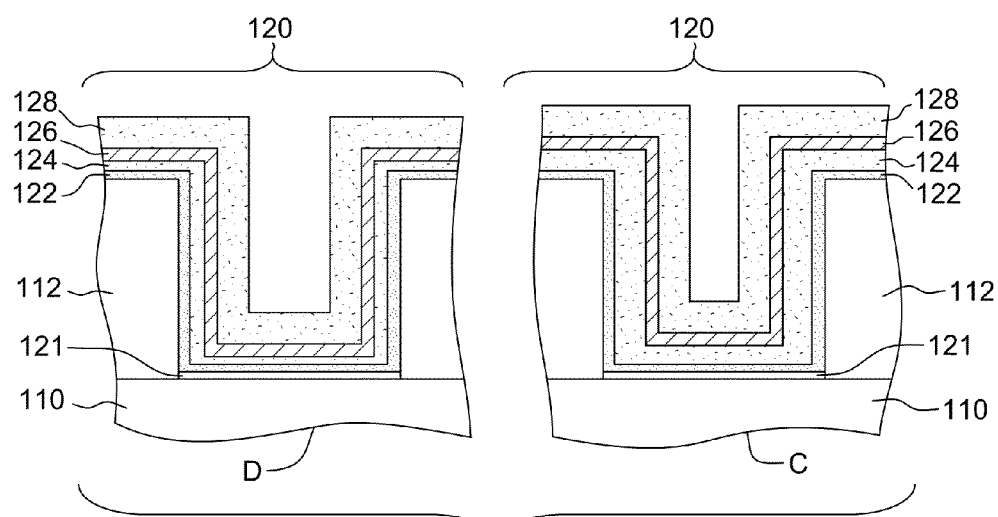

FIGS. 7A-7B illustrate the structure of FIGS. 6A-6B after depositing a material of a work function layer 128 over regions A, B, C and D. Prior to depositing of work function layer 128, an additional cap layer 126 can be deposited over layer 124. Cap layer 126 can be a tantalum nitride (TaN) layer. The material of work function layer 128 may be formed using any of the deposition processes described for depositing cap layer 126, as set forth herein. Cap layer 126 can be regarded as an etch stop layer in one embodiment. Where a layer functions as an etch stop it can be particularly resistant to being affected by depositions of layers above the etch or by removal of layers above the etch stop.

Work function layer 128 may be or include metals and their nitrides, such as titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN). In another example, work function layer 128 may be or include metals and their carbides, such as titanium carbide (TiC), titanium aluminum carbide (TiAlC), titanium aluminide (TiAl) tantalum carbide (TaC), tantalum aluminum carbide (TaAlC), niobium carbide (NbC), vanadium carbide (VC), etc. In another example, work function layer 128 may also include ruthenium (Ru), platinum (Pt), molybdenum (Mo), cobalt (Co) and alloys and combinations thereof. Work function layer 128 in the specific example of FIGS. 7A and 7B is a titanium carbide (TiC) work function layer. In one embodiment, a nitride of a metal can be regarded as a metal. In one embodiment, a carbide of a metal can be regarded as a metal.

Figure 8:
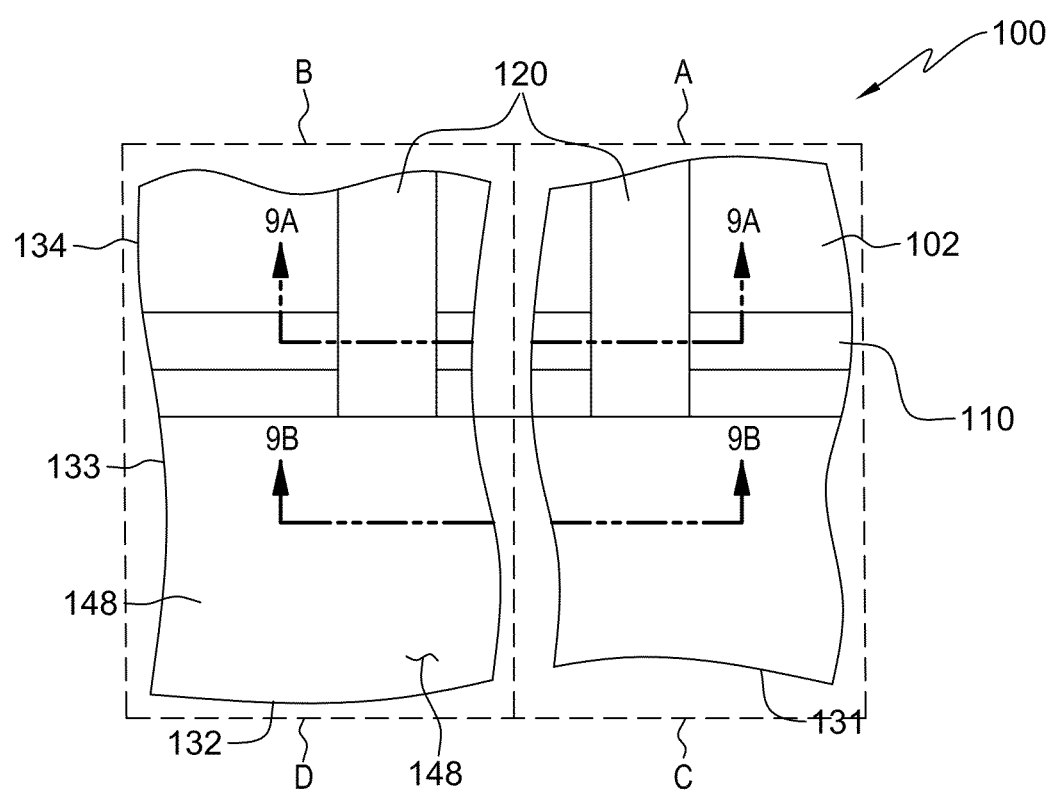
FIG. 8 illustrates the structure of FIGS. 7A-7B after providing a protective mask over first and second regions of the substrate structure, in accordance with one or more aspects as set forth herein.
Figure 9A:
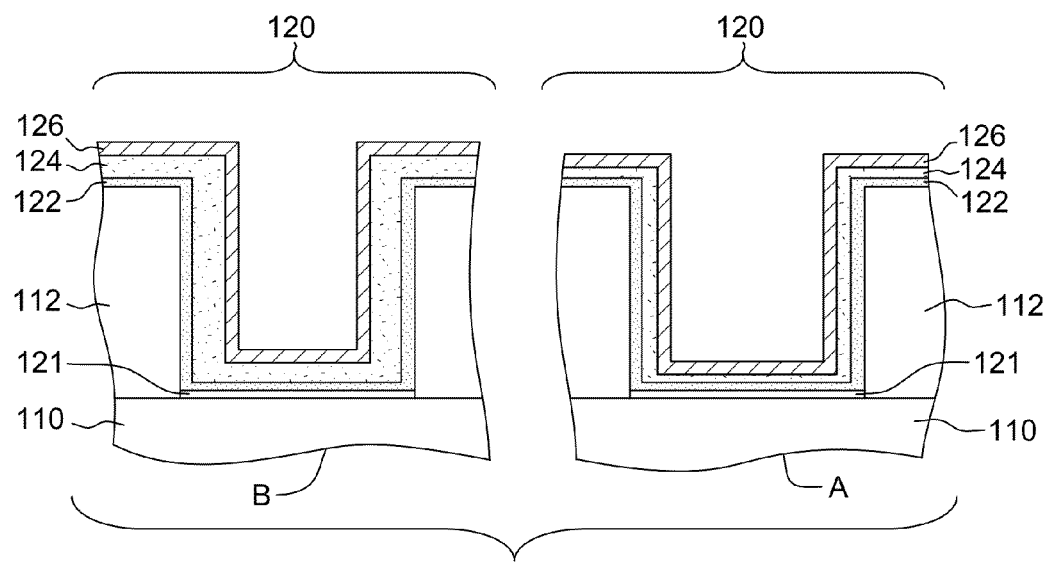
FIGS. 9A-9B depict the structure of FIG. 8 after removing, at least partially, the material of the unmasked regions of the substrate structure, in accordance with one or more aspects as set forth herein.
Figure 9B:
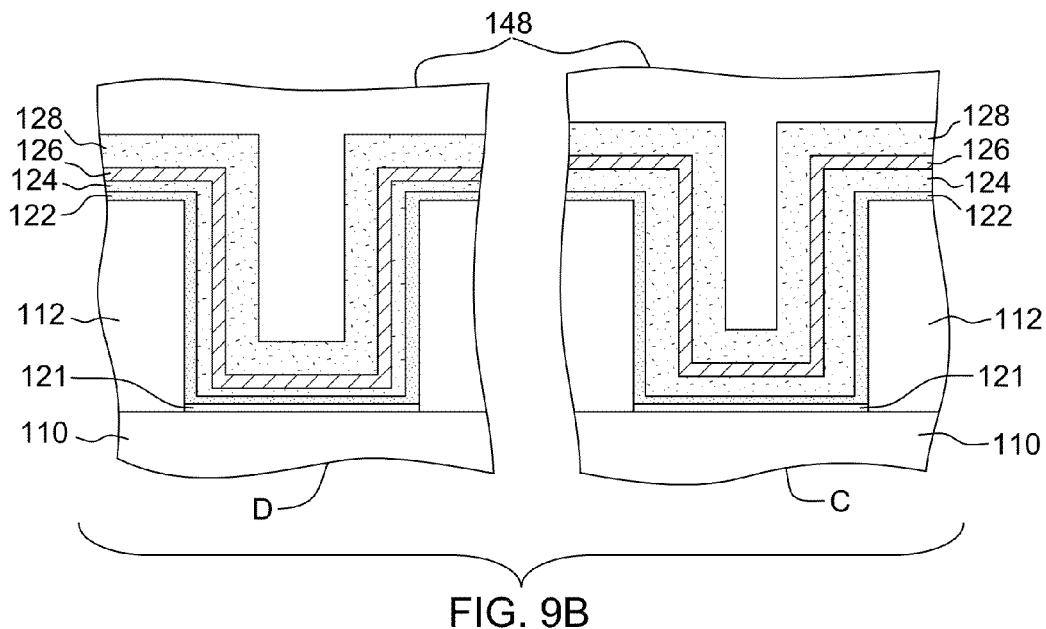

FIG. 8 illustrates the structure of FIGS. 7A-7B after providing another protective mask 148 providing masking over region C and region D of the substrate structure, leaving region A and region B exposed to the further processing steps to be disclosed with respect to FIGS. 9A and 9B. Protective mask 148 may have any of the properties previously described with respect to the protective mask of FIG. 4.

FIG. 9A illustrates the structure of FIG. 9, taken along line 9A-9A thereof, and FIG. 9B illustrates the structure of FIG. 8, taken along line 9B-9B thereof. As depicted in FIG. 9B, in one example, a process for sizing work function layer 128 can include removing material of work function layer 128 from region A and region B of the substrate structure and maintaining the deposited layer in its prior deposited form in region C and region D protected by mask 148. In another example, the material may be removed partially, in order to reduce a thickness of work function layer 128 in region. Removing work function layer 128 may be achieved using any of the removal processes described for removing cap layer 126 as set forth herein in reference to FIGS. 5A and 5B.

Figure 10A:
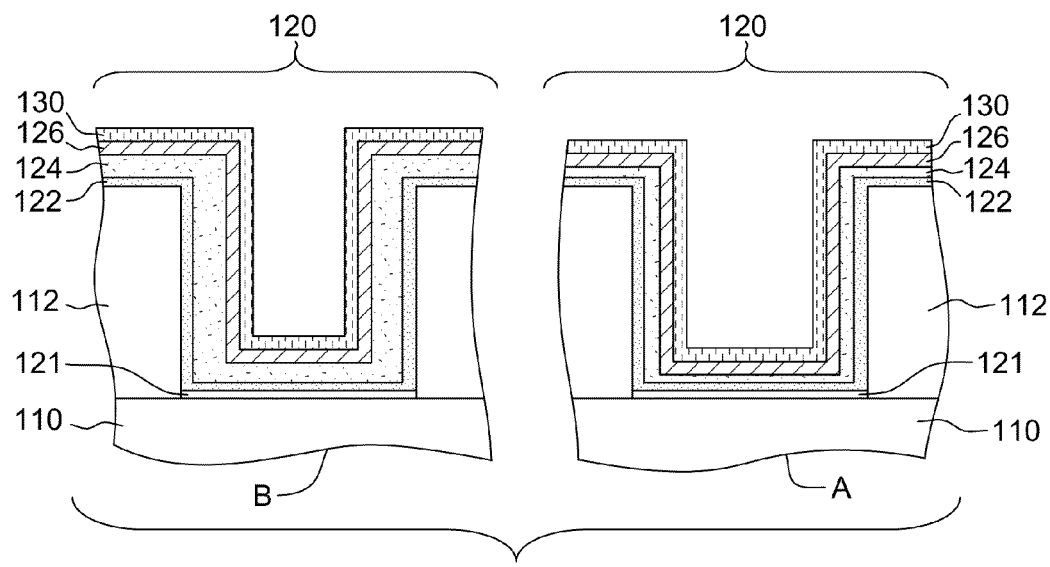
FIGS. 10A-10B depict the structure of FIGS. 9A-9B after depositing, at least partially, another material of another layer over the substrate structure, in accordance with one or more aspects as set forth herein.
Figure 10B:
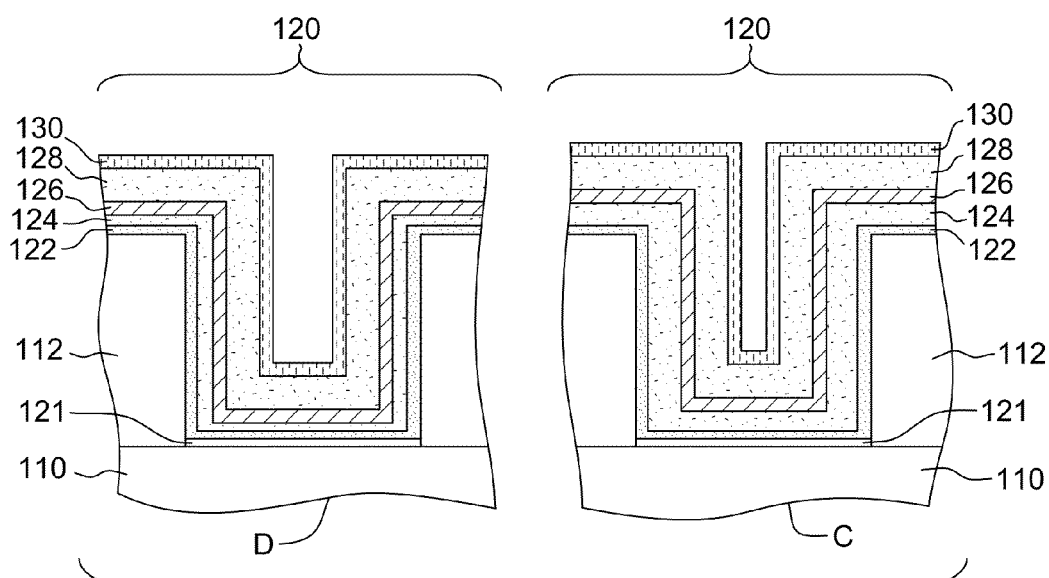

FIGS. 10A-10B illustrate the structure of FIGS. 9A-9B after removing the protective mask 148 and depositing the work function layer 130 over regions A, B, C and D. Depositing material of work function layer 130 may be accomplished using the techniques previously described with respect to FIGS. 2A and 2B.

In Table A there is illustrated layer thickness and layer material data for a specific example of a set of differentiated gate stacks fabricated using the method set forth in reference to FIGS. 2A-11B.

TABLE A

| | METHOD OF FIGS. 2A-11B | | | |
|---|---|---|---|---|
| Region | B | A | D | C |
| Vt level and channel doping | LVTP | RVTP | LVTN | RVTN |
| Layer 122 Dielectric | HK 12-15 Å, T = T(L122)$_1$ | HK 12-15 Å, T = T(L122)$_1$ | HK 12-15 Å, T = T(L122)$_1$ | HK 12-15 Å, T = T(L122)$_1$ |
| Layer 124 Cap | TiN 20-30 Å, T = T(L124)$_2$ | TiN 10-15 Å, T = T(L124)$_1$ | TiN 10-15 Å, T = T(L124)$_1$ | TiN 20-30 Å, T = T(L124)$_2$ |
| Layer 126 Cap | TaN 5-10 Å, T = T(L126)$_1$ | TaN 5-10 Å, T = T(L126)$_1$ | TaN 5-10 Å, T = T(L126)$_1$ | TaN 5-10 Å, T = T(L126)$_1$ |
| Layer 128 | Absent | Absent | TiC 50-60 Å, T = T(L128)$_1$ | TiC 50-60 Å, T = T(L128)$_1$ |
| Layer 130 Work Function | TiN 20-30 Å, T = T(L130)$_1$ | TiN 20-30 Å, T = T(L130)$_1$ | TiN 20-30 Å, T = T(L130)$_1$ | TiN 20-30 Å, T = T(L130)$_1$ |
| Vt | LVTP Vt Curve | RVTP Vt Curve | LVTN Vt Curve | RVTN Vt Curve |

Work function layer 130 may be or include TiN or TiC and may have a thickness of about 20 Å in one embodiment. In one specific example, work function layer 130 may be a TiN layer with thickness of about 20 Å. In one example, a FET in region A can be configured as a pFET having an RVT threshold voltage, a FET in region B can be configured as a pFET having an LVT threshold voltage, a FET in region C can be configured as an nFET having an RVT threshold voltage and a FET in region D can be configured as an nFET having an LVT threshold voltage. Cap layer 124, cap layer 126, work function layer 128 and work function layer 130 can be conductive layers.

Figure 11A:
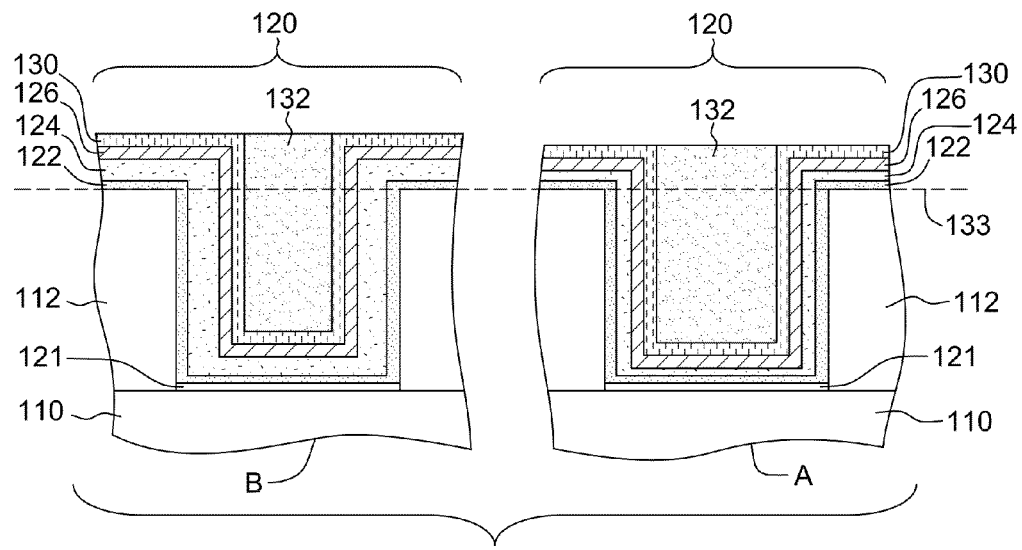
FIGS. 11A-11B depict the structure of FIGS. 10A-10B after depositing, at least partially, another material layer over the substrate structure, in accordance with one or more aspects as set forth herein.
Figure 11B:
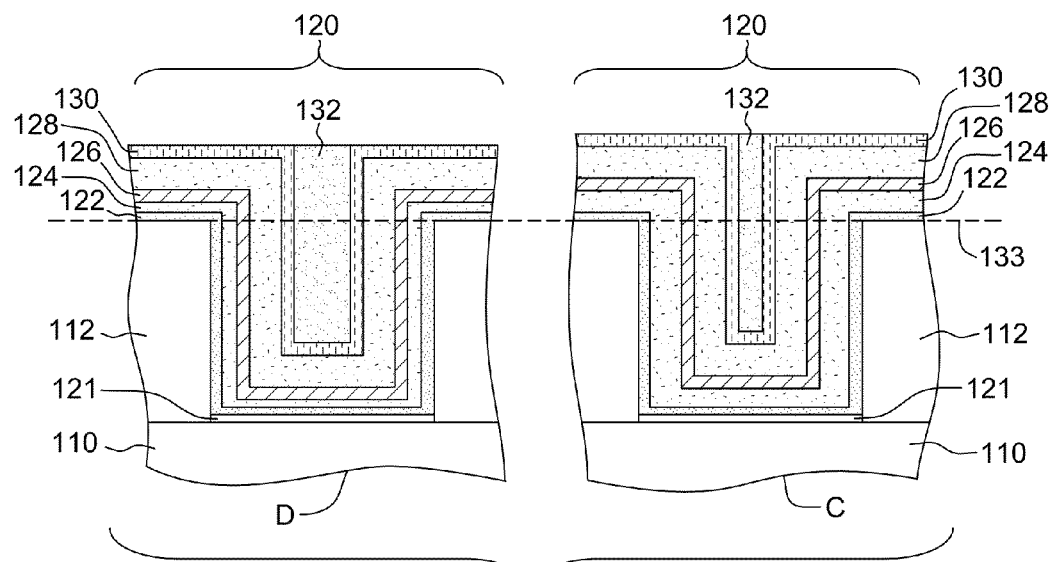

FIGS. 11A-11B illustrate the structure of FIGS. 10A-10B after filling varying gate structure 120 with a material 132. In one example, material 132 may be any suitable material, including a metal, such as tungsten (W). Because of the varying total height of varying gate structure 120, a sufficient amount of material 132 may be deposited to completely fill gate structure 120. After filling the gate structure 120 with material 132, the circuit structure may be subjected to a chemical mechanical polishing (CMP) process to remove extra gate stack material from various portions of the circuit structure. In one embodiment, material above elevation 133 can be removed.

As illustrated, varying gate structure 120 may have different layers of materials, including work function and cap layers, having different sizes in various regions of the substrate structure. Taken together, FIGS. 11A-11B illustrate four different gate stacks of varying gate structure 120 having four different size profiles, allowing for four different threshold voltages. As may be readily understood, by applying the techniques disclosed herein, varying gate structure 120 may be tuned in additional regions to yield additional different gate stacks, and therefore, different threshold voltages, including for example additional different pairs of threshold voltages for NFETs and PFETs.

With reference to the method of FIG. 2A-11B it will be seen that the count of FETs formed in a described region A B C D as set forth in connection within FIGS. 2A-11B can be established at any target number by including in mask 147 and mask 148 the appropriate number of mask apertures at specified locations so that the target number of FETs are fabricated.

In reference to Table A, it is seen that FETs of a common channel polarity in first and second different regions of a substrate structure can have first and second different gate stacks, wherein the first and second gate stacks have common gate layer material sequences. FETs in regions A and B can be pFETS have a common gate material sequences, but different gate layer material sequences. The gate layer sequences can be differentiated by a thickness of layer 124 being differentiated. In the embodiment of Table A thickness differentiation is not provided between any layers of the FETs in region A and B other than layer 124. Similarly, FETs in regions C and D can be nFETS have a common gate material sequences, but different gate layer material sequences. The gate layer sequences can be differentiated by a thickness of cap layer 124 being differentiated. In the embodiment of Table A thickness differentiation is not provided between any layers of the FETs in region C and D other than layer 124. Providing thickness variation only as between single layers of first and second gate stacks in one embodiment can simplify threshold voltage tuning. In one aspect the differentiated cap layer 124 can be proximate a dielectric layer 122 and in one embodiment can be adjacent to dielectric layer 122. Disposing a differentiated cap layer 124 proximate a channel can improve an ability to tune Vt to a desired value by thickness variation. In one embodiment, by disposing a thickness varying layer proximate a dielectric layer, significant differentiation between Vt values can be realized with relatively small variations in layer thicknesses. In another aspect, thickness differentiated cap layer 124 can be disposed below an etch stop layer, which in the embodiment summarized by Table A can be a TaN etch stop layer. In one embodiment, providing a tuning thickness differentiated layer below an etch stop layer can facilitate a deposition of a tuning layer, e.g., cap layer 124 having characteristics unlikely to be significantly affected by deposition or removal of layers above the etch stop layer.

By way of another example, in one embodiment, depositing, masking and material removal processes can be employed for fabrication of multiple structures having characteristics as set forth in Table B.

TABLE B

| Region | B | A | D | C |
|---|---|---|---|---|
| Layer 122 Dielectric | HK 12-15.6 Å, T = T(L122)₁ | HK 12-15.6 Å, T = T(L122)₁ | HK 12-15.6 Å, T = T(L122)₁ | HK 12-15.6 Å, T = T(L122)₁ |
| Layer 124 Cap | TiN 12-15 Å, T = T(L124)₁ | TiN 12-15 Å, T = T(L124)₁ | TiN 12-15 Å, T = T(L124)₁ | TiN 12-15 Å, T = T(L124)₁ |
| Layer 126 Cap | TaN 10-13 Å, T = T(L126)₂ | TaN 15-18 Å, T = T(L126)₁ | TaN 10-13 Å, T = T(L126)₂ | TaN 15-18 Å, T = T(L126)₁ |
| Layer 128 work function | TiN 40-50 Å, T = T(L128)₂ | TiN 20-30 Å, T = T(L128)₁ | absent | Absent |
| Layer 130 Work Function | TiC 50-60 Å, T = T(L130)₁ | TiC 50-60 Å, T = T(L130)₁ | TiC 50-60 Å, T = T(L130)₁ | TiC 50-60 Å, T = T(L130)₁ |

By way of another example, in one embodiment, depositing, masking and material removal processes can be employed for fabrication of multiple structures having characteristics as set forth in Table C.

TABLE C

| Region | B | A | D | C |
|---|---|---|---|---|
| Layer 122 Dielectric | HK 12-15.6 Å, T = T(L122)₁ | HK 12-15.6 Å, T = T(L122)₁ | HK 12-15.6 Å, T = T(L122)₁ | HK 12-15.6 Å, T = T(L122)₁ |
| Layer 124 Cap | TiN 10-15 Å, T = T(L124)₁ | TiN 10-15 Å, T = T(L124)₁ | TiN 10-15 Å, T = T(L124)₁ | TiN 10-15 Å, T = T(L124)₁ |
| Layer 126 Cap | TaN 10-18 Å, T = T(L126)₁ | TaN 10-18 Å, T = T(L126)₁ | TaN 10-18 Å, T = T(L126)₁ | TaN 10-18 Å, T = T(L126)₁ |
| Layer 128 Work function | TiN 40-50 Å, T = T(L128)₂ | TiN 20-30 Å, T = T(L128)₁ | absent | absent |
| Layer 130 Work Function | TiC 50-60 Å, T = T(L130)₂ | TiC 35-45 Å, T = T(L130)₁ | TiC 50-60 Å, T = T(L130)₂ | TiC 35-45 Å, T = T(L130)₁ |

In reference to the gate stack fabrication methods set forth herein, a work function of a gate stack can be regarded as a measurement of the energy provided by the gate stack for pulling an electron from a well region of a FET to a channel region of a FET. While various gate stack layers herein are referred to herein as "work function layers" it is understood that layers of a gate stack not referred to as "work function layer" can contribute to a work function of a gate stack, and therefore operate as a work function layer, though not labeled as such.

In the fabrication of FETs 50 having differentiated gate stacks formed in accordance with any of the methods described with reference to FIGS. 2A-11B, Tables 1-4 and Tables A-C, sources and drains 113 and 114 can be formed by appropriate doping of a fin 110 of a substrate structure having substrate 102 and fin 110 extending therefrom. In addition to having well doping and halos doping as set forth herein, fin 110 can be subject to extension doping for formation of extensions of source 113 and drain 114.

In one embodiment, masks as set forth herein can be arranged over an entire semiconductor wafer 1000 including integrated circuit 100 being fabricated when utilized to size one or more layer of a gate stack herein.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. An integrated circuit comprising:
   a substrate structure;
   a first plurality of field effect transistors formed in the substrate structure, a second plurality of field effect transistors formed in the substrate structure, a third plurality of field effect transistors formed in the substrate struc- ture, and a fourth plurality of field effect transistors formed in the substrate structure;

wherein field effect transistors of the first plurality of field effect transistors each have a first channel polarity and a first gate stack comprising a dielectric layer, a first conductive cap layer overlying the dielectric layer, a second conductive cap layer overlying the first cap layer, a first work function layer overlying the second conductive cap layer, and a metal layer overlying the first work function layer;

wherein field effect transistors of the second plurality of field effect transistors each have a second gate stack that comprises the layers of the first gate stack and the first channel polarity, the first conductive cap layer including a first thickness at the first gate stack and a second thickness at the second gate stack, wherein the second thickness is different from the first thickness;

wherein field effect transistors of the third plurality of field effect transistors each have a third gate stack and a channel polarity opposite the first channel polarity, the third gate stack comprising the layers of the first and second gate stacks and a second work function layer positioned between the second conductive cap layer and the first work function layer;

wherein field effect transistors of the fourth plurality of field effect transistors each have a fourth gate stack that comprises the layers of the third gate stack and a channel polarity opposite the first channel polarity, the first conductive cap layer including the first thickness at the fourth gate stack and the second thickness at the third gate stack;

wherein the second gate stack has a gate material sequence in common with the first gate stack, wherein the fourth gate stack has a gate material sequence in common with the third gate stack, and wherein the third gate stack has a gate material sequence that is different from a gate material sequence of the first gate stack;

wherein field effect transistors of the first plurality of field effect transistors each have a first Vt, and wherein field effect transistors of the second plurality of field effect transistors each have a second Vt, the second Vt being different from the first Vt.

2. The integrated circuit of claim 1, wherein the first conductive cap layer includes at least one of TiN, TaN and TiC.

3. The integrated circuit of claim 1, wherein the second conductive cap layer comprises an etch stop layer.

4. The integrated circuit of claim 1, wherein the field effect transistors of the first plurality of field effect transistors and the field effect transistors of the second plurality of field effect transistors have common gate lengths.

5. The integrated circuit of claim 1, wherein the first Vt is a low voltage Vt and wherein the second Vt is a regular voltage Vt.

6. A method for fabricating an integrated circuit, the method comprising:

depositing a plurality of gate stack layers, wherein the depositing includes varying a depositing of gate stack layers between first, second, third and fourth regions of a substrate structure so that there is defined at the first region of the substrate structure a first gate stack of a first field effect transistor having a first channel polarity and further so that there is defined at the second region of the substrate structure a second gate stack of a second field effect transistor having the first channel polarity and further so that there is defined at the third region of the substrate structure a third gate stack of a third field effect transistor having a second channel polarity opposite the first channel polarity and further so that there is defined at the fourth region of the substrate structure a fourth gate stack of a fourth field effect transistor having the second channel polarity, wherein the first gate stack and the second gate stake comprise a dielectric layer, a first conductive cap layer overlying the dielectric layer, a second conductive cap layer overlying the first conductive cap layer, a first work function layer overlying the second conductive cap layer, and a metal layer overlying the first work function layer, and wherein the third gate stack and the fourth gate stake comprise the dielectric layer, the first conductive cap layer overlying the dielectric layer, the second conductive cap layer overlying the first conductive cap layer, the first work function layer overlying the second conductive cap layer, a second work function layer underlying the first work function layer and the metal layer overlying the second work function layer;

wherein the depositing is performed so that the first conductive cap layer includes a first thickness at the first gate stack and the third gate stack and a second thickness at the second gate stack and the fourth gate stack, wherein the second thickness is different from the first thickness;

wherein the depositing is performed so that the second gate stack has a gate material sequence in common with the first gate stack, wherein the fourth gate stack has a gate material sequence in common with the third gate stack, and wherein the third gate stack has a gate material sequence that is different from a gate material sequence of the first gate stack;

wherein the fabricating is performed so that the first field effect transistor includes a first threshold voltage and further so that the second field effect transistor includes a second threshold voltage, the second threshold voltage being different from the first threshold voltage.

7. The method of claim 6, wherein the depositing is performed so that there is defined at the first region of the substrate structure a first plurality of field effect transistors, each having the first gate stack and further so that there is defined at the second region of the substrate structure a second plurality of field effect transistors, each having the second gate stack being different from the first gate stack.

8. The method of claim 6, wherein the first conductive cap layer includes TiN, and wherein the depositing includes depositing in the first region a first sublayer of TiN, depositing in the first region a sacrificial amorphous silicon layer on the first sublayer of TiN, and depositing in the first region a second sublayer of TiN on the first sublayer of TiN after removal of the amorphous silicon layer to form the first conductive cap layer.

9. The method of claim 6, wherein the first conductive cap layer includes TaN.

10. The method of claim 6, wherein the first conductive cap layer includes TiC.

11. The method of claim 6, wherein the second conductive cap layer comprises an etch stop layer.

12. The method of claim 6, wherein the varying a depositing includes using a mask patterned to include an opening in the second region to facilitate removal of material from the first conductive cap layer in the second region without removing material of the first conductive cap layer from the first region.

13. The method of claim 6, wherein the fabricating is performed so that a source and drain of the first field effect transistor and the second field effect transistor are formed in a common material layer defining the substrate structure.

14. The integrated circuit of claim 1, wherein the thickness of the second work function layer at the third gate stack is the same as at the fourth gate stack.

15. The integrated circuit of claim 1, wherein the first gate stack, the second gate stack, the third gate stack and the fourth gate stack each overly over a fin formed on the substrate structure.

16. The integrated circuit of claim 15, wherein the first gate stack, the second gate stack, the third gate stack and the fourth gate stack are formed on respective pairs of spaced apart spacers formed on the fin.

17. The integrated circuit of claim 16, wherein inner side walls of the pairs of spacers and the respective portions of the fin extending between spacers of the pairs of spacers form respective voids, and wherein the first gate stack, the second gate stack, the third gate stack and the fourth gate stack are formed in the respective voids.

18. The integrated circuit of claim 17, wherein an oxide layer extends on the respective portions of the fin extending between the spacers of the pairs of spacers, wherein the dielectric layer is formed on the inner side walls of the pairs of spacers and the oxide layer at the first gate stack, the second gate stack, the third gate stack and the fourth gate stack.

19. The integrated circuit of claim 1, wherein the first and second work function layers of each of the third and fourth gate stacks include a combined thickness that is greater than a thickness of the first work function layer of each of the first and second gate stacks.

20. The integrated circuit of claim 1, wherein the first and second work function layers include at least one of a metal and its nitride, a metal and its carbide, ruthenium (Ru), platinum (Pt), molybdenum (Mo), cobalt (Co) or alloys thereof.

* * * * *